United States Patent
Lee et al.

(10) Patent No.: US 9,431,458 B2
(45) Date of Patent: Aug. 30, 2016

(54) SEMICONDUCTOR DEVICES AND METHODS OF MANUFACTURING THE SAME

(71) Applicant: SAMSUNG ELECTRONICS CO., LTD., Suwon-Si, Gyeonggi-Do (KR)

(72) Inventors: Jin-Woo Lee, Hwaseong-Si (KR);
Youn-Seon Kang, Yongin-Si (KR);
Jung-Moo Lee, Hwaseong-Si (KR);
Seung-Jae Jung, Suwon-Si (KR);
Hyun-Su Ju, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/980,247

(22) Filed: Dec. 28, 2015

(65) Prior Publication Data

US 2016/0148977 A1    May 26, 2016

Related U.S. Application Data

(62) Division of application No. 14/323,301, filed on Jul. 3, 2014, now Pat. No. 9,269,746.

(30) Foreign Application Priority Data

Nov. 12, 2013    (KR) ........................ 10-2013-0136809

(51) Int. Cl.
*H01L 47/00* (2006.01)
*H01L 45/00* (2006.01)
*H01L 27/24* (2006.01)

(52) U.S. Cl.
CPC ....... *H01L 27/2409* (2013.01); *H01L 27/2463* (2013.01); *H01L 27/2481* (2013.01);

(Continued)

(58) Field of Classification Search
CPC ............ H01L 27/249; H01L 27/2409; H01L 27/2463; H01L 27/2481; H01L 45/16; H01L 45/065; H01L 45/085; H01L 45/142; H01L 45/145; H01L 45/147; H01L 45/1226; H01L 45/1233; H01L 45/1253; H01L 45/1675
USPC ...... 438/95, 198, 199, 382, 483, 588; 257/2, 257/3, 4, 5, 379, 536, 537, E45.002, 257/E47.001, E27.004, E27.073
See application file for complete search history.

(56) References Cited

U.S. PATENT DOCUMENTS 5,952,671 A    9/1999  Reinberg et al.
6,236,059 B1 *  5/2001  Wolstenholme .. H01L 21/28512
                                                        257/2

(Continued)

FOREIGN PATENT DOCUMENTS

KR    20050085607 A    8/2005
KR       0908812 B     7/2009

(Continued)

*Primary Examiner* — Dao H Nguyen
(74) *Attorney, Agent, or Firm* — Volentine & Whitt, PLLC

(57) ABSTRACT

A semiconductor device includes a first electrode on a substrate, a selection device pattern, a variable resistance layer pattern, a first protective layer pattern, a second protective layer pattern and a second electrode. The selection device pattern is wider, in a given direction, than the variable resistance layer pattern. The first protective layer pattern is formed on a first pair of opposite sides of the variable resistance layer pattern. The second protective layer pattern is formed on a second pair of opposite of the variable resistance layer pattern. The second electrode is disposed on the variable resistance layer pattern.

4 Claims, 21 Drawing Sheets

(52) U.S. Cl.
CPC ............ *H01L45/04* (2013.01); *H01L 45/085* (2013.01); *H01L 45/1226* (2013.01); *H01L 45/1233* (2013.01); *H01L 45/1253* (2013.01); *H01L 45/142* (2013.01); *H01L 45/145* (2013.01); *H01L 45/146* (2013.01); *H01L 45/147* (2013.01); *H01L 45/1675* (2013.01); *H01L 27/249* (2013.01); *H01L 45/1616* (2013.01)

(56) References Cited

U.S. PATENT DOCUMENTS

| | | | |
|---|---|---|---|
| 7,482,616 | B2 | 1/2009 | Song et al. |
| 8,372,732 | B2 | 2/2013 | Kim |
| 8,481,431 | B2 | 7/2013 | Rouh et al. |
| 8,654,705 | B2 | 2/2014 | Wang et al. |
| 2008/0248632 | A1* | 10/2008 | Youn .................. H01L 27/2409 438/483 |
| 2009/0075472 | A1 | 3/2009 | Arnold et al. |
| 2009/0098728 | A1 | 4/2009 | Grunow et al. |
| 2009/0242867 | A1 | 10/2009 | Rho |
| 2011/0248235 | A1 | 10/2011 | Jeong |
| 2012/0091422 | A1* | 4/2012 | Choi .................. H01L 27/2409 257/4 |
| 2012/0153380 | A1 | 6/2012 | Lee et al. |
| 2012/0302047 | A1 | 11/2012 | Lee et al. |
| 2012/0329269 | A1 | 12/2012 | Arnold et al. |
| 2013/0102125 | A1 | 4/2013 | Venigalla et al. |
| 2014/0106535 | A1* | 4/2014 | Lee .......................... H01L 45/06 438/382 |
| 2015/0340610 | A1* | 11/2015 | Jung .................. H01L 45/1293 257/4 |
| 2016/0013406 | A1* | 1/2016 | Lee .................... H01L 45/1253 257/4 |

FOREIGN PATENT DOCUMENTS

| | | |
|---|---|---|
| KR | 20120029594 A | 3/2012 |
| KR | 1137928 B | 5/2012 |
| KR | 1149054 B | 5/2012 |
| KR | 20120059003 A | 6/2012 |
| KR | 20120068523 A | 6/2012 |
| KR | 1185994 B | 9/2012 |
| KR | 1212567 B | 12/2012 |
| KR | 20120131048 A | 12/2012 |
| KR | 20130022337 A | 3/2013 |
| KR | 20130022881 A | 3/2013 |
| KR | 20130023766 A | 3/2013 |
| KR | 20130023767 A | 3/2013 |
| KR | 20130033695 A | 4/2013 |

* cited by examiner

1ST DIRECTION  2ND DIRECTION

1ST DIRECTION  2ND DIRECTION

1ST DIRECTION  2ND DIRECTION

SEMICONDUCTOR DEVICES AND METHODS OF MANUFACTURING THE SAME

PRIORITY STATEMENT

This is a Divisional of U.S. Non-Provisional application Ser. No. 14/323,301, filed Jul. 3, 2014, which makes a claim of priority under 35 USC §119 to Korean Patent Application No. 10-2013-0136809, filed on Nov. 12, 2013 in the Korean Intellectual Property Office (KIPO), the contents of which are hereby incorporated by reference in their entirety.

BACKGROUND

1. Field

The inventive concept relates to semiconductor devices and methods of manufacturing the same. More particularly, the inventive concept relates to semiconductor devices having vertical memory cell structures and methods of manufacturing the same.

2. Description of the Related Art

A semiconductor device may include a multi-layered pattern structure. To form such a structure, different types of layers are formed one atop the other on a substrate, and these layers are patterned by an etching process to form vertical structures constituting memory cells, for example, of the device. Electrical and mechanical properties of the semiconductor device may thus depend on how robust the multi-layered pattern structure is.

SUMMARY

According to an aspect of the inventive concept, there is provided a semiconductor device including a substrate having an upper surface, a first electrode on the upper surface of the substrate, a selection device pattern on the first electrode, a variable resistance layer pattern on top of the selection device pattern, wherein the variable resistance layer pattern is narrower than the selection device pattern in a first direction parallel to the upper surface of the substrate, and the variable resistance layer pattern has a first pair of sides facing in opposite ways along a second direction, and a second pair of sides facing in opposite ways along the first direction, first protective vertical layers extending along the first sides of the variable resistance layer pattern, respectively, so as to cover the first sides in the first direction, second protective vertical layers extending along the second sides of the variable resistance layer pattern, respectively, so as to cover the second sides in the second direction; and a second electrode on the variable resistance layer pattern.

According to another aspect of the inventive concept, there is provided a semiconductor device including a substrate, a two-dimensional array of pillars extending upright on the substrate, wherein the pillars are spaced from each other in first and second directions that are parallel to an upper surface of the substrate, and each of the pillars has an upper portion and a lower portion that is wider than the upper portion in at least one of the first and second directions, protective material that encases the upper portion of each of the pillars so as to surround the variable resistance layer pattern of each of the pillars, and interlayer insulating material disposed on the substrate and occupying regions between the pillars including regions between the protective material that encases the upper portions of the pillars, and in which the upper portion of each of the pillars includes a variable resistance layer pattern of material whose resistance can be changed, and the protective material comprises protective layer patterns that sit atop the lower portions of the pillars.

According to another aspect of the inventive concept, there is provided a method of manufacturing a semiconductor device, which includes forming a first electrode layer, a selection device layer and a variable resistance layer sequentially on a substrate, selectively etching the variable resistance layer to form preliminary variable resistance layer patterns each extending longitudinally in a first direction, forming a first protective layer along sides of the preliminary variable resistance layer patterns, and a top surface of the selection device layer, etching portions of the first protective layer, the selection device layer and the first electrode layer situated between the preliminary variable resistance layer patterns to form first protective layer patterns, preliminary selection device patterns and first electrodes, forming a second electrode layer on the preliminary variable resistance layer patterns, selectively etching the second electrode layer and the preliminary variable resistance layer patterns to form second electrodes and variable resistance layer patterns, the second electrodes each extending longitudinally in a second direction that crosses the first direction, forming a second protective layer along side surfaces of the second electrodes, sides the variable resistance layer patterns, and sides of the preliminary selection device patterns, and etching portions of the second protective layer and the preliminary selection device patterns situated between the variable resistance layer patterns to form second protective layer patterns and selection device patterns.

BRIEF DESCRIPTION OF THE DRAWINGS

The inventive concept will be more clearly understood from the following detailed description of the preferred embodiments made in conjunction with the accompanying drawings.

DETAILED DESCRIPTION OF THE PREFERRED EMBODIMENTS

Figure 1:
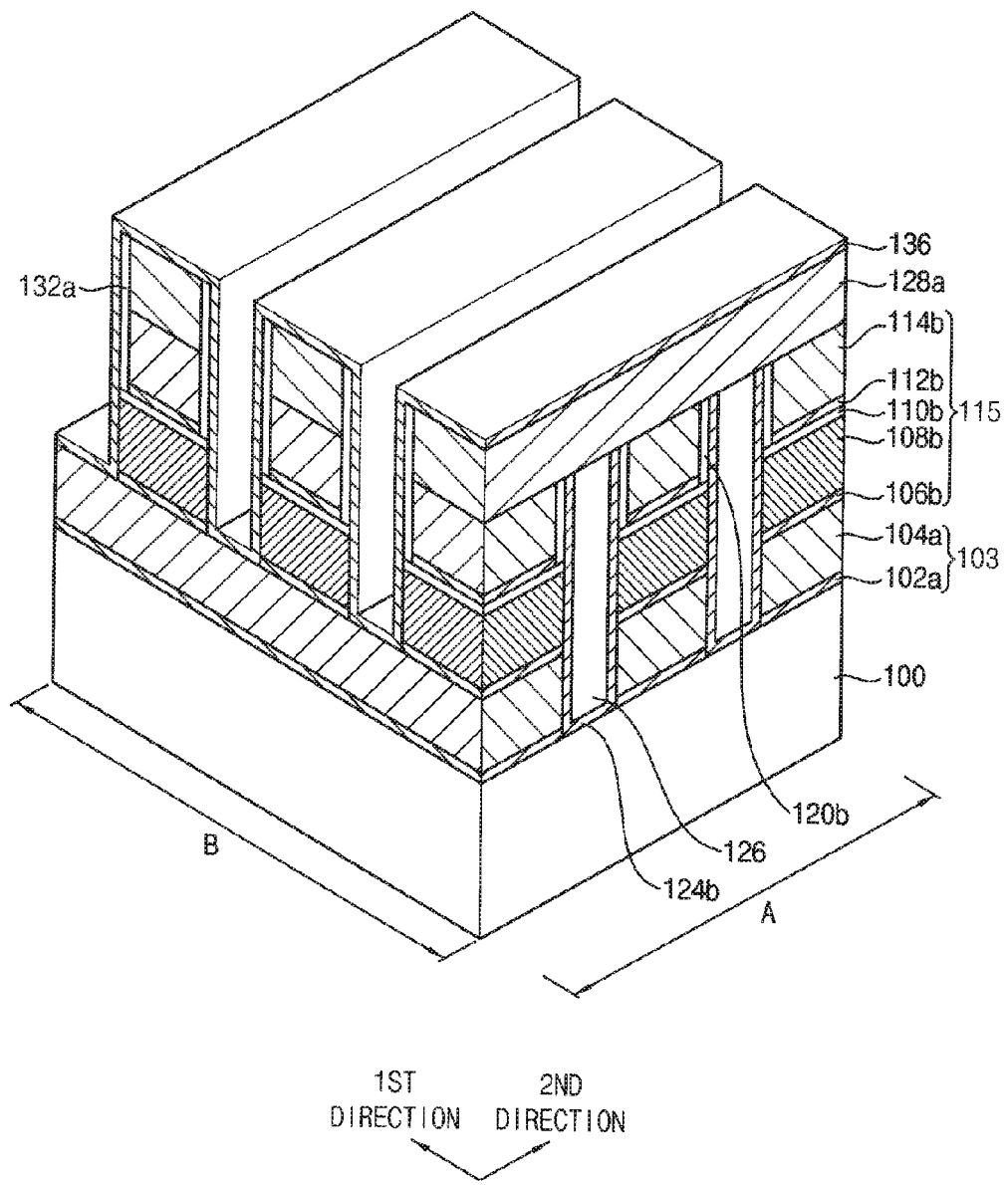
FIG. 1 is a perspective view of a semiconductor device in accordance with the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer is referred to as being on or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present. The same applies to the term "covering".

It will also be understood that although the terms first, second, third, etc. are used herein to describe various elements, regions, layers, etc., these elements, regions, and/or layers are not limited by these terms. These terms are only used to distinguish one element, layer or region from another at the particular place where they are used.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the terms "upper" or "bottom" as used to describe a surface generally refer not only to the orientation depicted in the drawings but may refer to the fact that the surface is the uppermost or bottommost surface in the orientation depicted, as would be clear from the drawings and context of the written description.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "pattern" may be used to refer to one feature in a series of similar features that have been formed by some patterning process and/or may refer collectively to the entire series of features formed by the patterning process. Also, at times a pattern that has the form of a layer may be referred to as a "layer", i.e., the term "layer" does not necessarily refer to a global layer in the device. Also, when a feature is described as "extending" in a particular direction or directions, it will be understood that those direction correspond to a major dimension of the feature such as its length as the context and figures will make clear.

A semiconductor device in accordance with the inventive concept will now be described in detail with reference to FIG. 1 and FIG. 2.

The semiconductor memory device may comprise a resistive memory device. The resistive memory device may be a non-volatile memory device in which the resistance of a layer is variable to store data. Such a variable resistive memory device may have a high degree of integration compared to other conventional memory devices, and may be operated with a relatively low amount of power.

Figure 2:
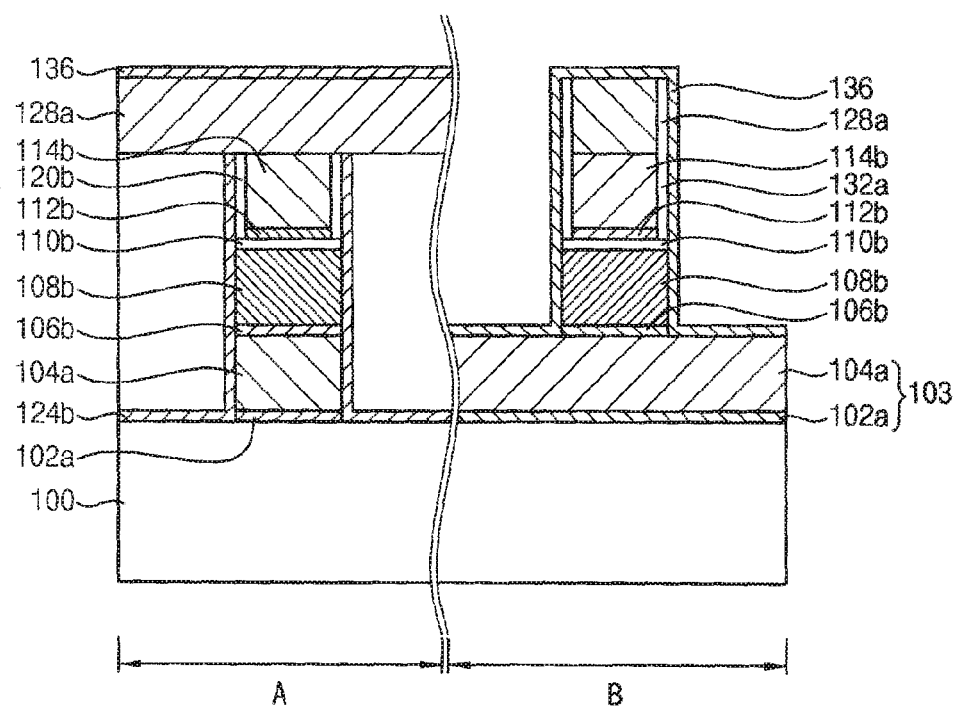
FIG. 2 shows cross-sectionals of the semiconductor device of FIG. 1 as taken along lines A and B, respectively.

Referring to FIGS. 1 and 2, the semiconductor device may include first electrodes (referred to hereinafter as first electrode patterns) 103, pillar structures 115, second electrodes (referred to hereinafter as second electrode patterns) 128a, first to third protective layer patterns 120b, 124b and 132a, and a fourth protection layer 136. The first electrode patterns 103, the pillar structures 115 and the second electrode patterns 128a may be disposed one atop the other in the foregoing order. Each pillar structure 115 may include, i.e., may by made up of at least, a selection device pattern 108b and a variable resistance layer pattern 112b.

The first and electrode patterns 103 and 128a may be spaced apart from each other in a vertical direction with respect to a top surface of a substrate 100. The first and electrode patterns 103 and 128a may extend perpendicularly to each other. For example, the first electrode pattern 103 may have a linear shape and extend longitudinally in a first ($1^{ST}$) direction. The second electrode pattern 102a may have a linear shape and extend longitudinally in a second ($2^{ND}$) direction substantially perpendicular to the first direction.

Accordingly, each pillar structure 115 is interposed between respective ones of the first and second electrode patterns 103 and 128a. In particular, each pillar structure 115 may be located at a point where respective first and second electrode patterns 103 and 128a are seen to cross as viewed in plan (which may be referred to hereinafter as a "cross point").

Thus, a plurality of the pillar structures 115 may be disposed on each first electrode pattern 103 and under each second electrode pattern 128a. Each pillar structure 115 and the portions of the first and second electrode patterns 103 and 128a which are disposed on top and below the pillar structure 115 may provide a respective memory cell.

In the semiconductor device, the resistance of the variable resistance layer pattern 112b of the pillar structure 115 may be changed by an electric field between the first and second electrode patterns 103 and 128a, so that data may be stored in the memory cell. For example, when the variable resistance layer pattern 112b is changed from a high resistance state to a low resistance state, data may be stored. When the variable resistance layer pattern 112b is in the high resistance state, e.g., an off-state, a flow of current between the first and second electrode patterns 103 and 128a may be substantially blocked. In contrast, when the variable resistance layer pattern 112b is in the low resistance state, e.g., an on-state, a current may flow between the first and second electrode patterns 103 and 128a. Data may be stored and identified using the above-mentioned characteristics. Thus, operational characteristics of the semiconductor device may be affected by electrical characteristics of the variable resistance layer pattern 112b.

The first electrode pattern 103 may include a conductive material, e.g., a metal. The first electrode pattern 103 may have a multi-layered (stacked) structure including a first barrier metal layer pattern 102a and a first metal layer pattern 104a. The first barrier metal layer pattern 102a may include titanium (Ti), titanium nitride (TiN), tantalum (Ta) or tantalum nitride (TaN). The first metal layer pattern 104a may include gold (Au), silver (Ag), copper (Cu), aluminum (Al), titanium aluminum nitride (TiAlN), tungsten (W), tungsten nitride (WN), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn) or a combination thereof. In one example of this embodiment, the first metal layer pattern 104a includes a transparent conductive material, e.g., indium tin oxide (ITO).

The width of the first electrode pattern 103 is the dimension of the first electrode pattern 103 in the second direction. That is, the first electrode pattern 103 has side surfaces facing opposite ways in the second direction. The second protective layer pattern 124b may be disposed on the side surfaces of the first electrode pattern 103.

The selection device pattern 108b of the pillar structure 115 may include a selective device material which is capable of selecting an electrical signal. For instance, the selection device pattern 108b may be a silicon diode or an oxide diode. The variable resistance layer pattern 112b may include a material, a resistance of which may be changed according to the electrical signal applied thereto. At least one metal layer pattern may be further disposed on lower and upper surfaces of the selection device pattern 108b, and on lower and upper surfaces of the variable resistance layer pattern 112b.

In the illustrated example of this embodiment, the pillar structure 115 includes a second barrier metal layer pattern 106b, the selection device pattern 108b, a second metal layer pattern 110b, the variable resistance layer pattern 112b and a third metal layer pattern 114b, stacked one atop the other in the foregoing order.

The second barrier metal layer pattern 106b may comprise Ti, TiN, Ta or TaN.

The selection device pattern 108b may comprise a silicon-based material, a transition metal compound or a chalcogenide glass. For example, the selection device pattern 108b may have a metal-silicon-metal (MSM) structure.

The second metal layer pattern 110b may be interposed between the selection device pattern 108b and the variable resistance layer pattern 112b. The second metal layer pattern 112b may be formed of Au, Ag, Cu, Al, Ti, TiN, TiAlN, Ta, TaN, W, WN, Ir, Pt, Pd, Ru, Zr, Rh, Ni, Co, Cr, Sn, Zn, ITO or a combination thereof. However, in another example of this embodiment, the second metal layer pattern 112b is omitted.

The variable resistance layer pattern 112b may comprise a metal oxide, the resistance of which can be changed according to an electric field applied thereto. The variable resistance layer pattern 112b may comprise nickel oxide, titanium oxide, tungsten oxide, tantalum oxide, aluminum oxide, zirconium oxide, hafnium oxide, copper oxide, cobalt oxide, iron oxide, vanadium oxide, yttrium oxide, molybdenum oxide, lanthanum oxide, or the like. Alternatively, the variable resistance layer pattern 112b may comprise an oxide having a perovskite structure, e.g., praseodymium calcium manganese oxide (PrCaMnO) or doped strontium titanium oxide (SrTiO). Still further, the variable resistance layer pattern 112b may comprise a solid electrolyte, e.g., germanium tellurium (GeTe) or germanium sulfide (GeS), which may contain a diffusive metal ion, e.g., copper or silver.

The third metal layer pattern 114b may be disposed on the variable resistance layer pattern 112b to protect the top surface of the variable resistance layer pattern 112b. The third metal layer pattern 114b may comprise Au, Ag, Cu, Al, Ti, TiN, TiAlN, Ta, TaN, W, WN, Ir, Pt, Pd, Ru, Zr, Rh, Ni, Co, Cr, Sn, Zn, ITO or a combination thereof. However, in another example of this embodiment, the third metal layer pattern 114b is omitted.

Hereinafter, that portion of the pillar structure 115 beneath the variable resistance layer pattern 112b will be referred to as a lower portion of the pillar structure 115, and that portion of the pillar structure 115 including the variable resistance layer pattern 112b and any pattern thereon will be referred to as an upper portion of the pillar structure 112b.

The lower portion of the pillar structure 115 (made up of the second barrier metal layer pattern 106b, the selection device pattern 108b and the second metal layer pattern 110b in this example) may be wider, in the aforementioned second ($2^{ND}$) direction, than the upper portion of the pillar structure 115 (made up of the variable resistance layer pattern 112b and the third metal layer pattern 114b). Also, the lower portion of the pillar structure 115 may be wider, in the aforementioned first ($1^{ST}$) direction, than upper portion of the pillar structure 115. Accordingly, side surfaces of the pillar structure 115 may have bends in them. Those side surfaces of an element/structure facing in opposite ways in the second direction will be referred to as a first side surface and a second side surface, respectively. Those side surfaces of an element/structure facing opposite ways in the first direction will be referred to as a third side surface and a fourth side surface, respectively.

The first protective layer pattern 120b may be formed on the first and second side surfaces of the upper portions of the pillar structures 115. The third protective layer pattern 132a may be formed on the third and fourth side surfaces of the upper portions of the pillar structures 115. Therefore, the first and third protective layer patterns 120b and 132a may protect the sides of the variable resistance layer pattern 112b. In the illustrated example of this embodiment, the variable resistance layer pattern 112b is surrounded by the first and third protective layer patterns 120b and 132a.

Outer side surfaces of the first and third protective layer patterns 120b and 132a may be coplanar with side surfaces of the selection device pattern 108b.

The second electrode pattern 128a may serve as a bit line. The second electrode pattern 128a may have the same width as the upper portion of the pillar structure 115 in the first direction.

The second electrode pattern 128a may comprise a metal. For example, the second electrode pattern 128a may comprise Au, Ag, Cu, Al, Ti, TiN, TiAlN, Ta, TaN, W, WN, Ir, Pt, Pd, Ru, Zr, Rh, Ni, Co, Cr, Sn, Zn, ITO or a combination thereof.

The third protective layer pattern 132a and the fourth protective layer 136 may also be disposed on the side surfaces of the second electrode pattern 128a.

The second protective layer pattern 124b may be disposed on side surfaces of the first protective layer pattern 120b, the second metal layer pattern 110b, the selection device pattern 108b and the second barrier metal layer pattern 106b, and on a side surface of the first electrode pattern 103 and a top surface of the substrate 100. The fourth protective layer 136 may be disposed on side surfaces of the third protective layer pattern 132a, the second metal layer pattern 110b, the selection device pattern 108b and the second barrier metal layer pattern 106b, and on top surfaces of the first and second electrode patterns 103 and 128a.

According to examples of the present embodiment as described above, a double-layered protective pattern covers the side surfaces of the upper portion of the pillar structure 115, whereas a single-layered protective pattern covers the side surfaces of the lower portion of the pillar structure 115. In these examples, side surfaces of the variable resistance layer pattern 112b are surrounded the first, second and third protective layer patterns 120b, 124b and 132a, and the fourth protective layer 136.

The first and third protective layer patterns 120b and 132a may comprise protective insulation material. The second protective layer pattern 124b and the fourth protective layer 136 may also comprise protective insulation material. For example, the first to third protective layer patterns 120b, 124b and 132a, and the fourth protective layer 136 may each be formed of a silicon oxide, silicon nitride or a metal oxide alone or in a combination thereof. An example of the metal oxide is aluminum oxide. The first to third protective layer patterns 120*b*, 124*b* and 132*a*, and the fourth protective layer 136 may be formed of substantially the same insulation material or at least one may be formed of a substantially different insulation materials from that of the others.

An insulation layer pattern 126 may be interposed between the adjacent first electrode patterns 103 and between the adjacent pillar structures 115.

FIGS. 3 to 14 are perspective views illustrating a method of manufacturing the semiconductor device of FIG. 1

Figure 3:
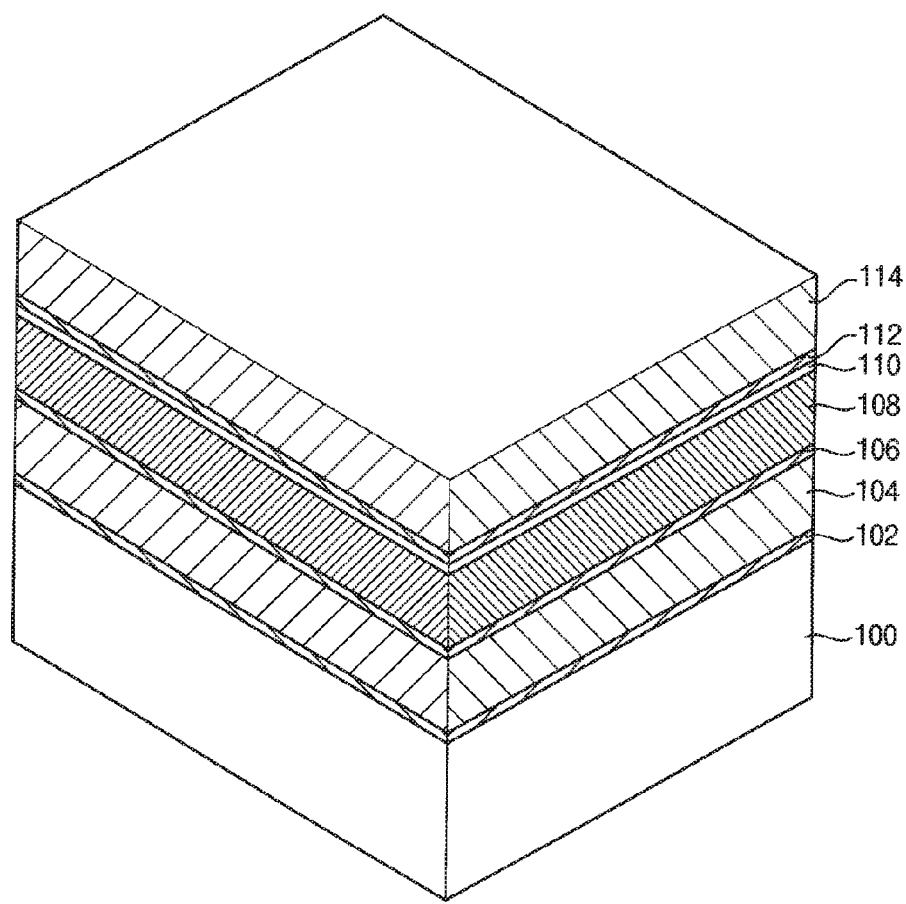
FIGS. 3, 4, 5, 6, 7, 8, 9, 10, 11, 12, 13 and 14 are perspective views illustrating a method of manufacturing the semiconductor device of FIG. 1.

Referring to FIG. 3, a first barrier metal layer 102 and a first metal layer 104 may be formed on a substrate 100. The first barrier metal layer 102 and the first metal layer 104 may constitute a first electrode layer.

A second barrier metal layer 106, a selection device layer 108, a second metal layer 110, a variable resistance layer 112 and a third metal layer 114 may be sequentially formed on the first metal layer 104, i.e., on the first electrode layer.

Figure 4:
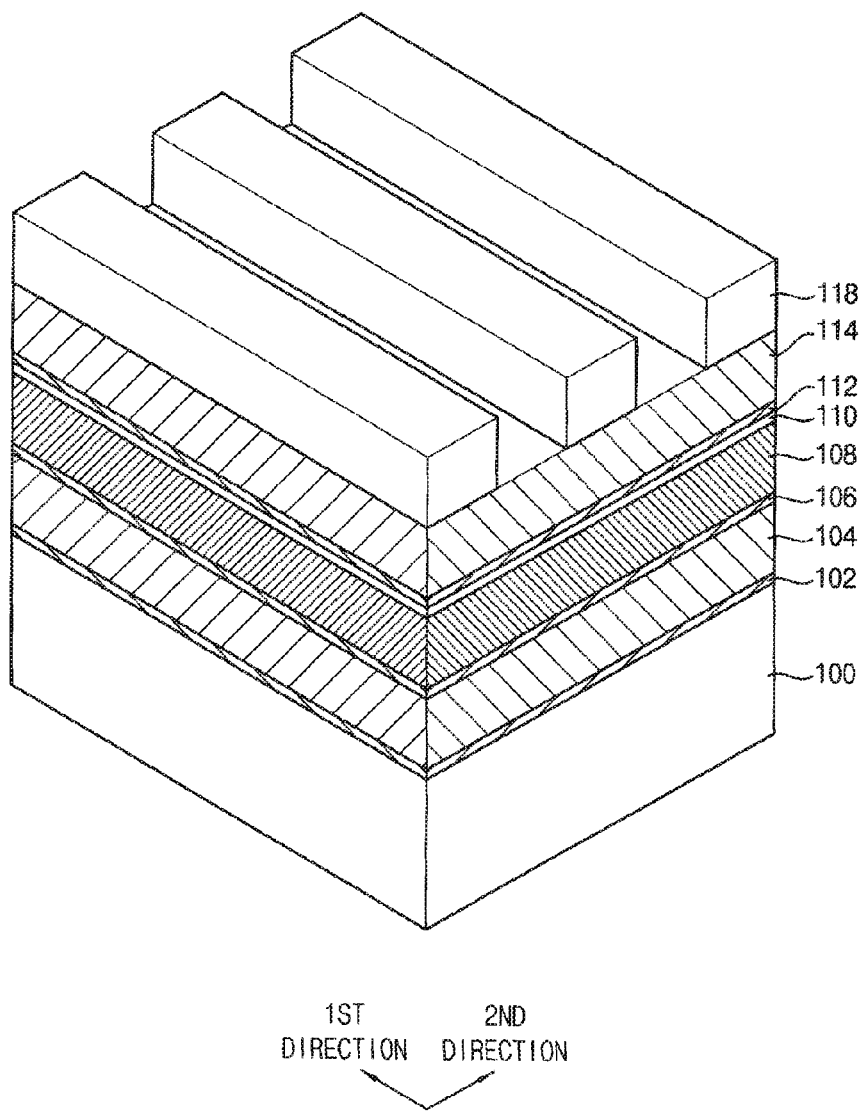

Referring to FIG. 4, a first hard mask layer may be formed on the third metal layer 114. The first hard mask layer may comprise a silicon oxide, a spin-on hard mask (SOH) material or silicon oxynitride. Therefore, the first hard mask layer may have a multi-layered structure including two or more of the above materials. In an example of this embodiment, the first hard mask layer includes a silicon oxide layer, an SOH layer and a silicon oxynitride layer.

The first hard mask layer may be patterned by, e.g., a photolithography process, to form a first hard mask pattern 118. In the above-mentioned example of this embodiment, the silicon oxynitride layer and the SOH layer are removed such that the first hard mask layer pattern 118 is a silicon oxide layer pattern. The first hard mask pattern 118 may include a plurality of linear segments each extending longitudinally in the first direction.

Figure 5:
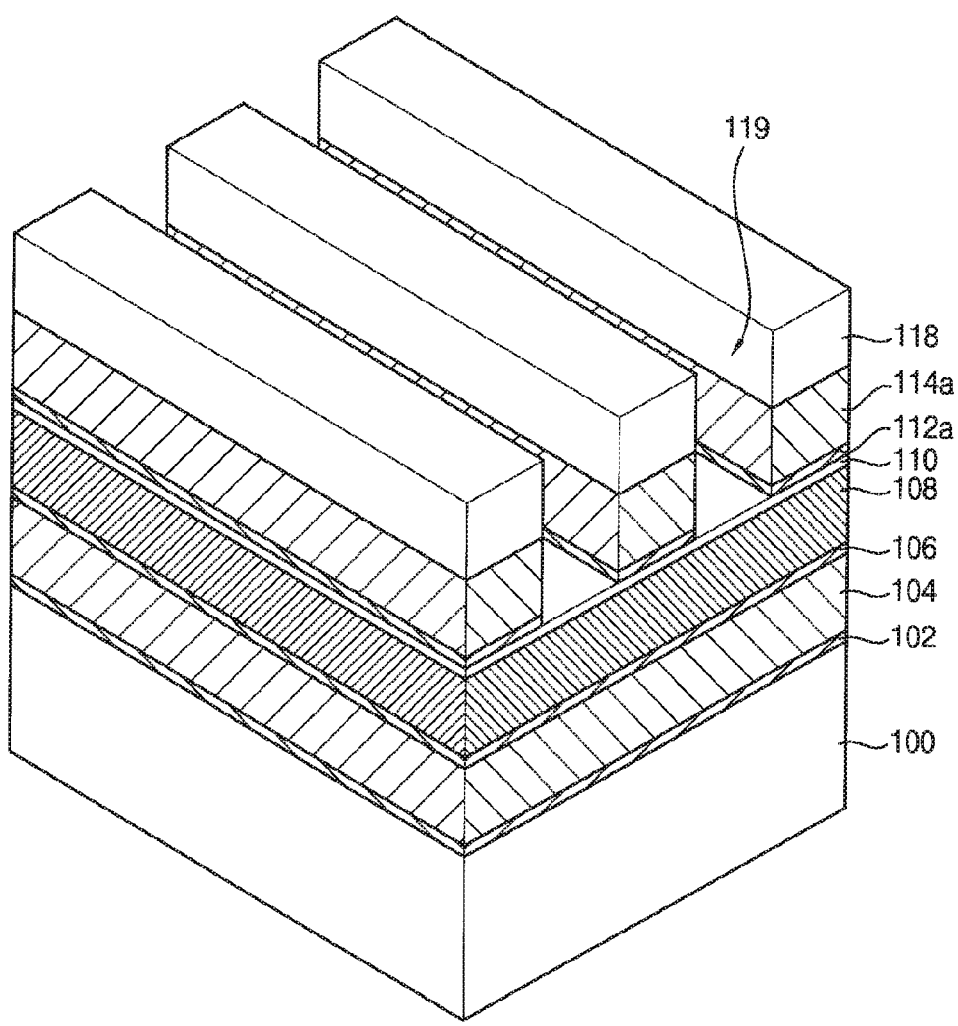

Referring to FIG. 5, the third metal layer 114 and the variable resistance layer 112 may be etched using the first hard mask pattern 118 as an etching mask to form a third preliminary metal layer pattern 114*a* and a preliminary variable resistance layer pattern 112*a*. A first trench 119 may be defined between the adjacent third preliminary metal layer patterns 114*a* and between the adjacent preliminary variable resistance layer patterns 112*a*. The etching process may be an anisotropic etching process.

In the illustrated example of this embodiment, the layers under the preliminary variable resistance layer pattern 112*a* are not etched by this etching process. Thus, the period during which a side surface of the preliminary variable resistance layer pattern 112*a* is exposed may be kept to a minimum.

Figure 6:
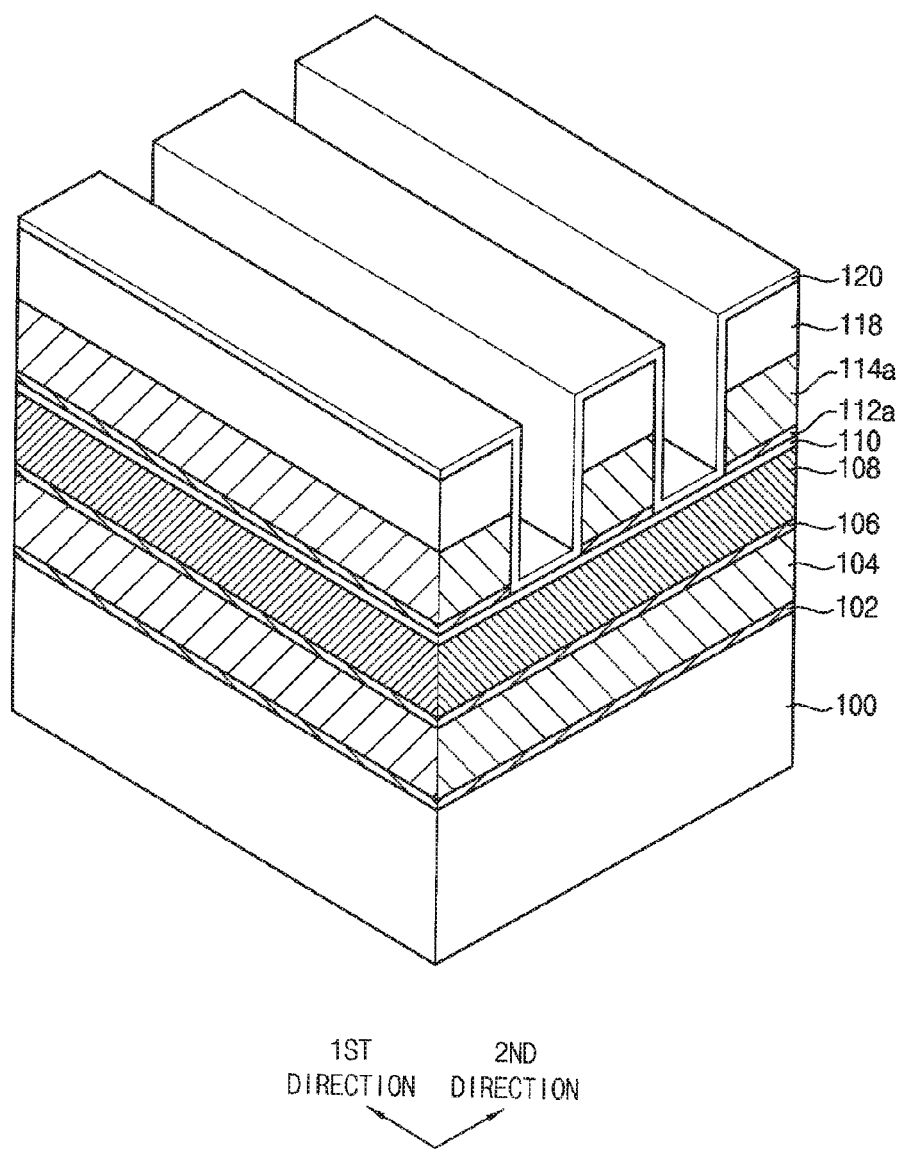

Referring to FIG. 6, a first protective layer 120 may be formed on surfaces of the third preliminary metal layer pattern 114*a* and the preliminary variable resistance layer pattern 112*a*, and along the bottom of the first trench 119. The first protective layer 120 may be formed along the side of the first trench 119 and may not completely fill the first trench 119. The side surface of the preliminary variable resistance layer pattern 112*a* may be protected by the first protective layer 120.

The first protective layer 120 may be formed of material that will not be etched substantially during a subsequent etching process so as not to produce an etching residue. The first protective layer 120 may be formed of insulation material, e.g., silicon oxide, silicon nitride or a metal oxide, alone or in combination. As mentioned above, aluminum oxide is an example of an appropriate metal oxide.

Figure 7:
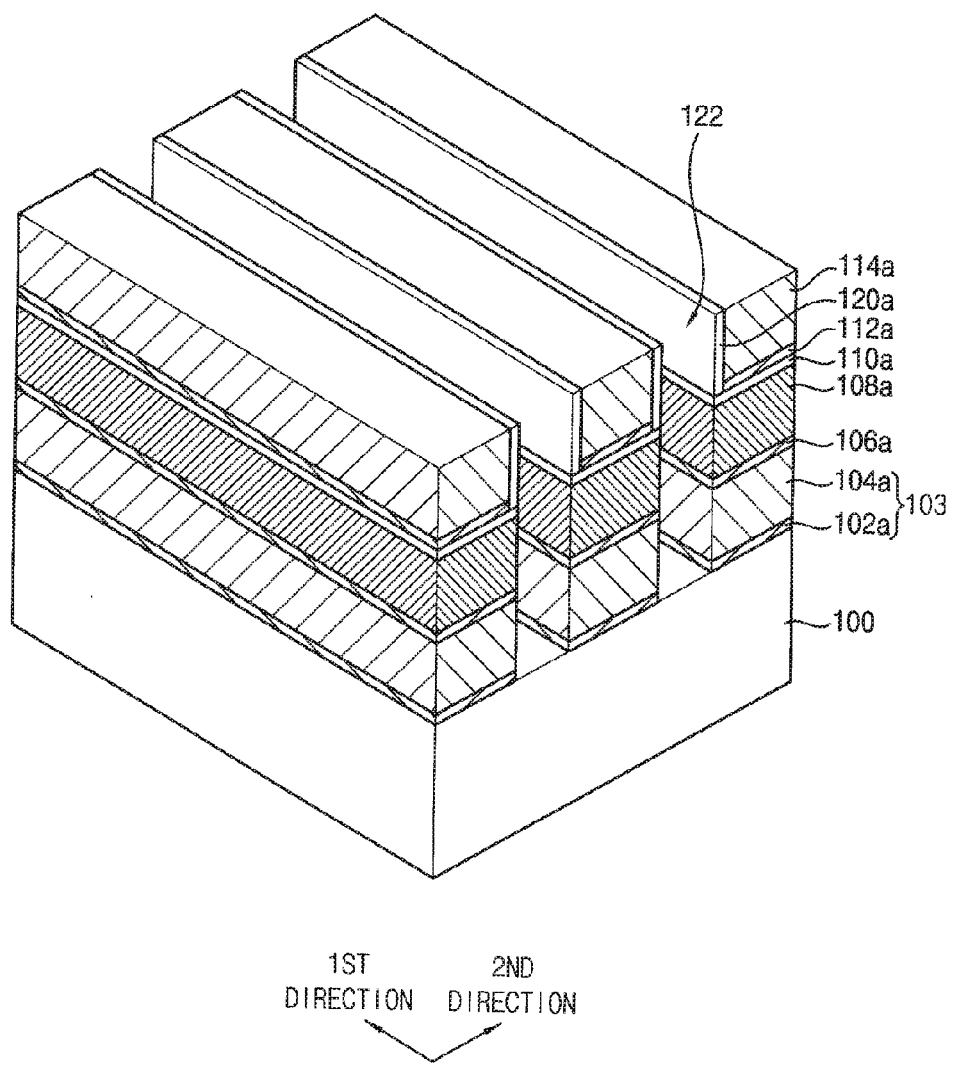

Referring to FIG. 7, the first protective layer 120 may be etched from the bottom of the first trench 119. Subsequently, the second metal layer 110, the selection device layer 108, the second barrier metal layer 106, the first metal layer 104 and the first barrier metal layer 102 may be sequentially etched.

As a result, a first barrier metal layer pattern 102*a*, a first metal layer pattern 104*a*, a second preliminary barrier metal layer pattern 106*a*, a preliminary selection device pattern 108*a*, a second preliminary metal layer pattern 110*a* may be formed. A first preliminary protective layer pattern 120*a* may be formed on side surfaces of the preliminary variable resistance layer pattern 112*a* and the third preliminary metal layer pattern 114*a*.

A second trench 122 may be formed by the above etching process. The first barrier metal layer pattern 102*a* and the first metal layer pattern 104*a* may be provided as a first electrode pattern 103. The first electrode pattern 103 may have a linear shape extending longitudinally in the first direction.

A first structure including the first electrode pattern 103, the second preliminary barrier metal layer pattern 106*a*, the preliminary selection device pattern 108*a* and the second preliminary metal layer pattern 110*a* has a wider cross section, in the second direction, than a second structure including the preliminary variable resistance layer pattern 112*a* and the third preliminary metal layer pattern 114*a* may have a second width. The width of the first structure may be equal to the width of the second structure plus twice the (deposition) thickness of the first protective layer 120.

The first protective layer 120 remains on side surfaces of the preliminary variable resistance layer pattern 112*a* while the layers under the preliminary variable resistance layer pattern 112*a* are etched. Accordingly, the side surfaces of the preliminary variable resistance layer pattern 112*a* may be prevented from being damaged by the etching process, so that electrical properties of the preliminary variable resistance layer pattern 112*a* may be maintained.

The first hard mask pattern 118 may be partially removed by the etching process. Remaining portions of the first hard mask pattern 118 may be removed by an additional etching process.

Figure 8:
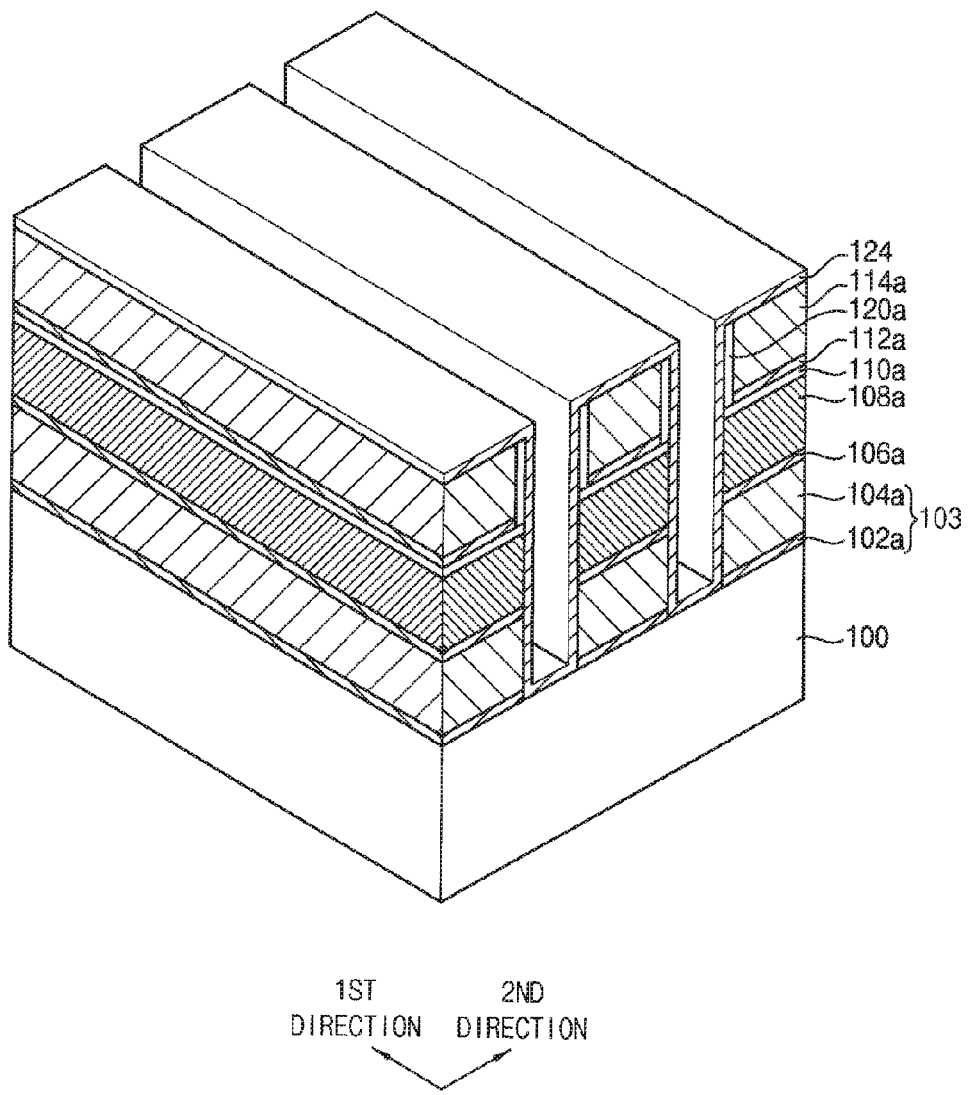

Referring to FIG. 8, a second protective layer 124 may be formed on surfaces of the first preliminary protective layer pattern 120*a*, the second preliminary metal layer pattern 110*a*, the preliminary selection device pattern 108*a*, the second preliminary barrier metal layer pattern 106*a*, the first metal layer pattern 104*a* and the first barrier metal layer pattern 102*a*, and along the bottom of the second trench 122. Side surface of each of these patterns may be protected by the second protective layer 124. The second protective layer 124 may be formed of an insulation material, e.g., silicon oxide, silicon nitride or a metal oxide, alone or in combination. Aluminum oxide is an example of an appropriate metal oxide. The second protective layer 124 may be formed of substantially the same or different insulation material as the first protective layer 120.

Figure 9:
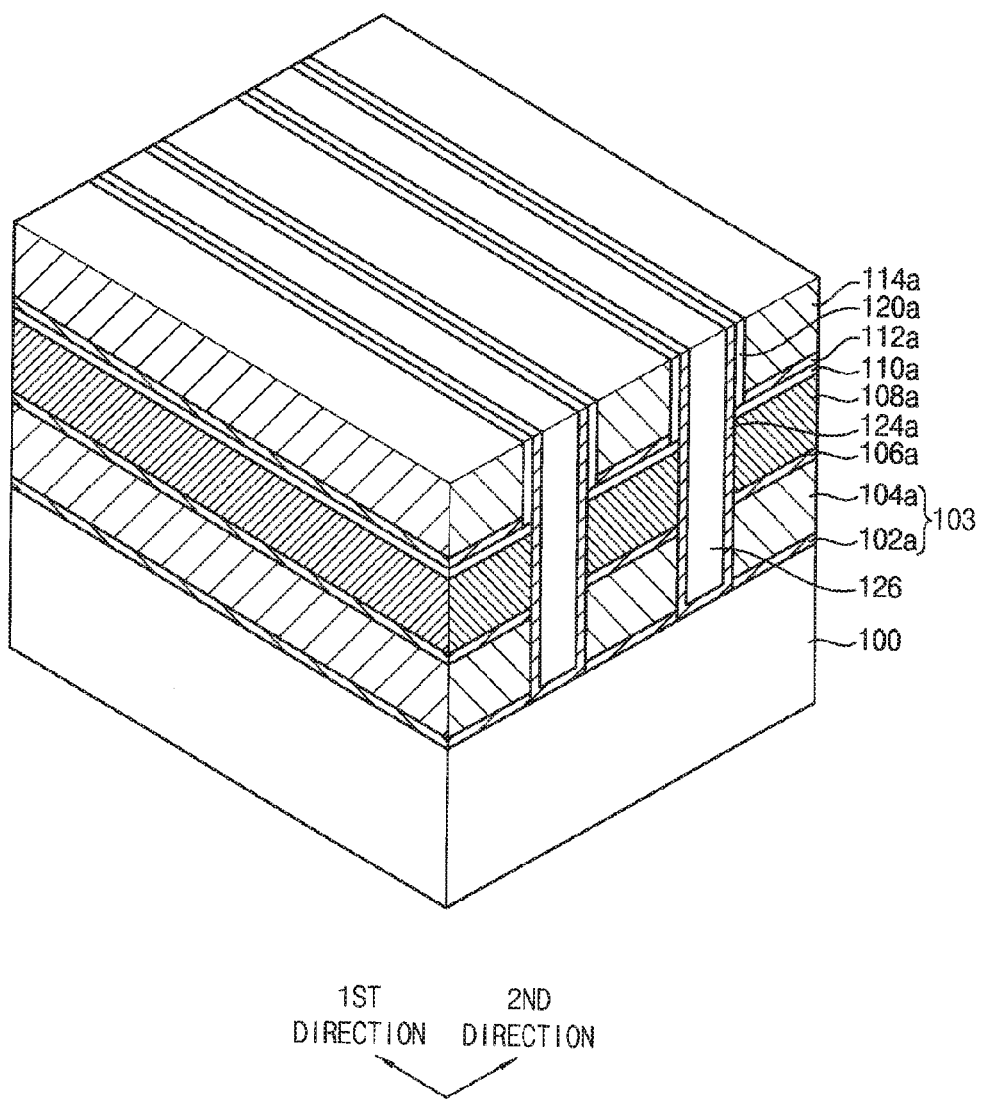

Referring to FIG. 9, an insulation layer may be formed on the second protective layer 124 to fill (overfill) the second trench 122. An upper portion of the insulation layer may be planarized to form an insulation layer pattern 126 in the second trench 122. A top surface of the third preliminary metal layer pattern 114*a* may be exposed by the planarization process. A second preliminary protective layer pattern 124*a* may be formed on the side of the second trench 122 by the planarization process.

Figure 10:
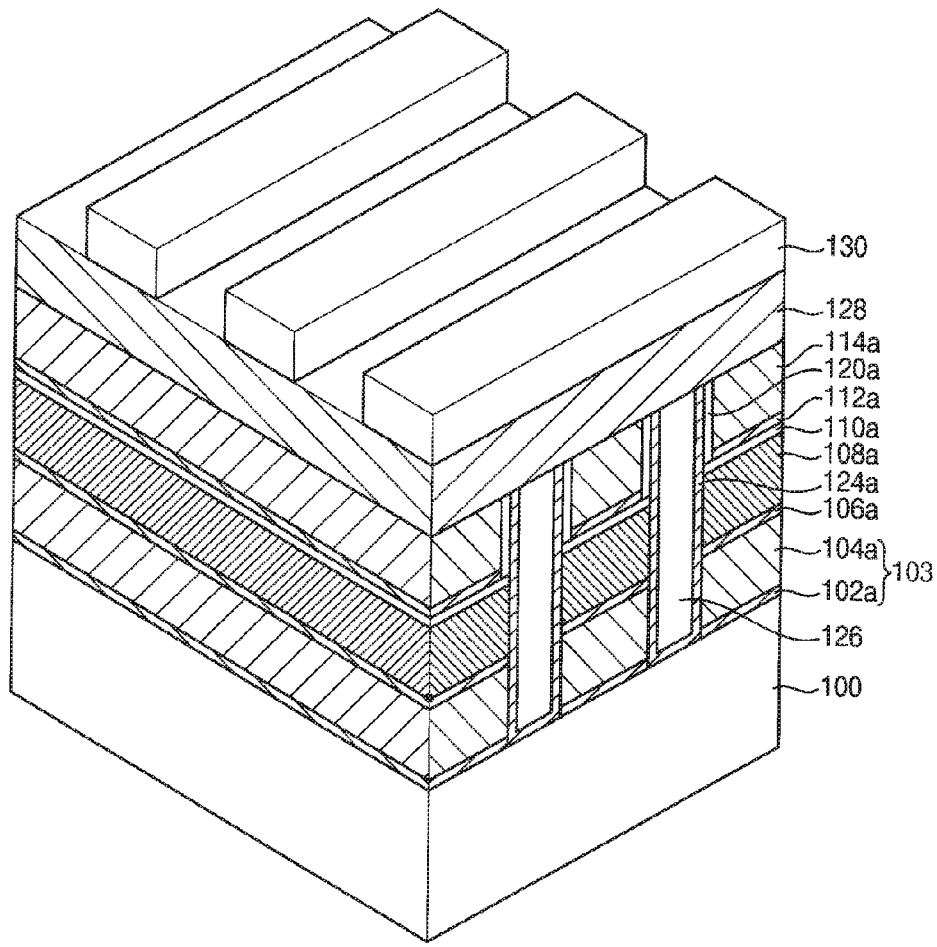

Referring to FIG. 10, a fourth metal layer 128 may be formed on the third preliminary metal layer pattern 114*a*, the insulation layer pattern 116, the first preliminary protective layer pattern 120*a* and the second preliminary protective layer pattern 124a. The fourth metal layer 128 may be transformed into a second electrode pattern by a subsequent process.

For example, a second hard mask pattern 130 may be formed on the fourth metal layer 128. The second hard mask pattern 130 may have linear segments extending longitudinally in the second direction substantially perpendicular to the first direction.

Figure 11:
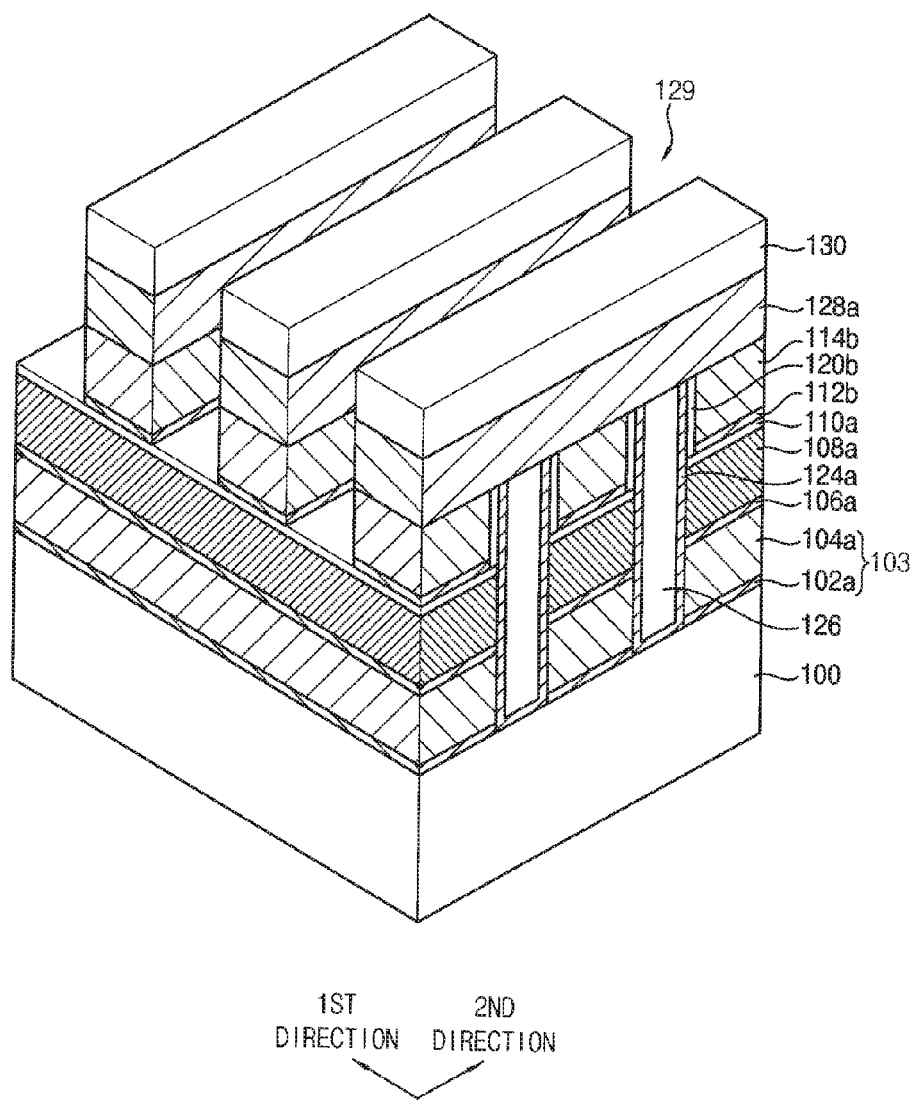

Referring to FIG. 11, the fourth metal layer 128, the third preliminary metal layer pattern 114a and the preliminary variable resistance layer pattern 112a may be etched using the second hard mask pattern 130 as an etching mask. Accordingly, a second electrode pattern 128a, a third metal layer pattern 114b and a variable resistance layer pattern 112b may be formed. A third trench 129 may be defined by a space left when portions of the fourth metal layer 128, the third preliminary metal layer pattern 114a and the preliminary variable resistance layer pattern 112a are removed. The third metal layer pattern 114b and the variable resistance layer pattern 112b may have a shape substantially that of a pillar. The first preliminary protective layer pattern 120a may also be etched to form a first protective layer pattern 120b.

Figure 12:
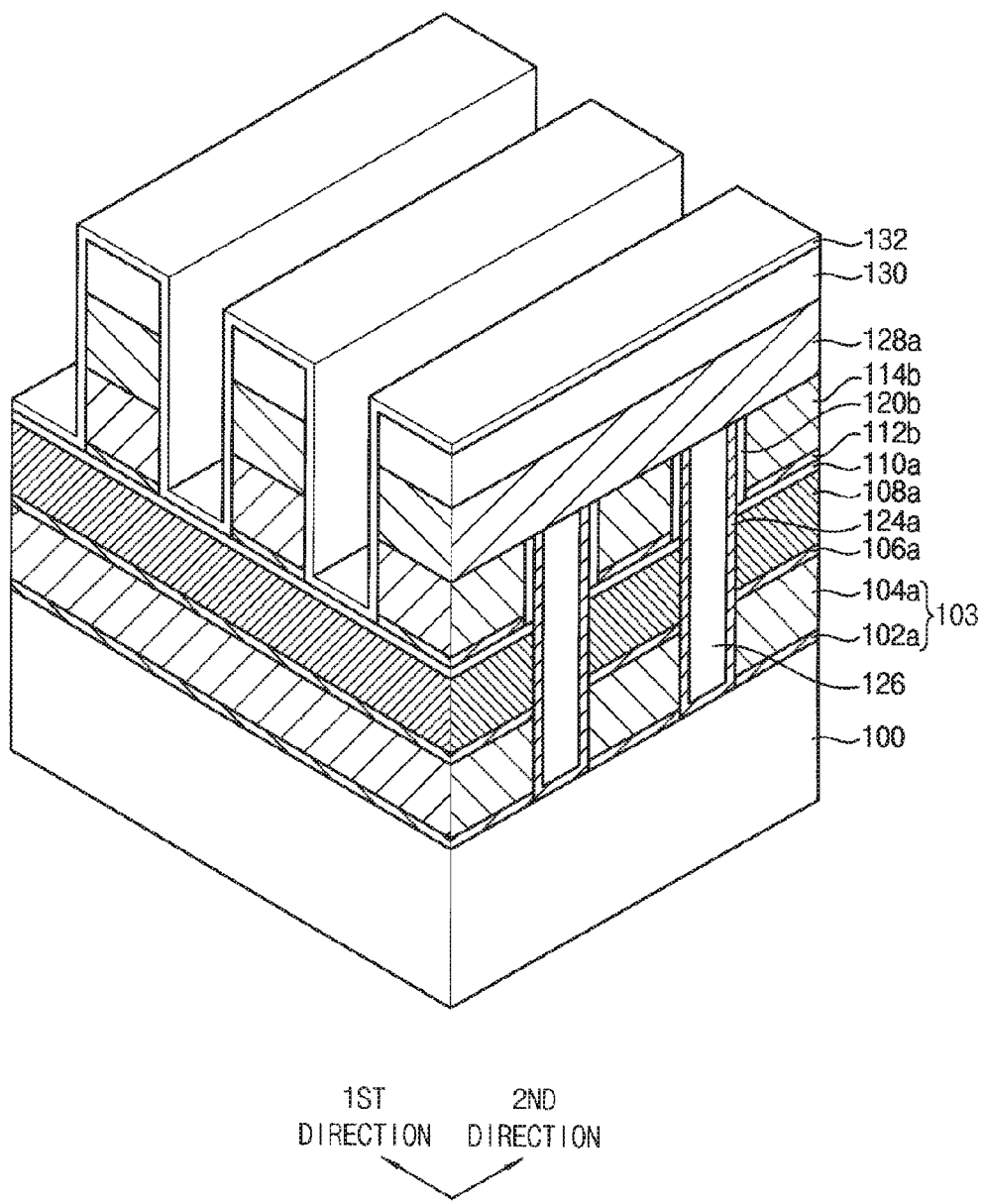

Referring to FIG. 12, a third protective layer 132 may be formed on surfaces of the second hard mask pattern 130, the second electrode pattern 128a, the third metal layer pattern 114b and the variable resistance layer pattern 112b, and along the bottom of the third trench 129. The third protective layer 132 may be formed along the side of the third trench 129 and may not completely fill the third trench 129. A side surface of the variable resistance layer pattern 112b may be protected by the third protective layer 132.

The third protective layer 132 may be formed of insulation material, e.g., silicon oxide, silicon nitride or a metal oxide, alone or in combination. Aluminum oxide is an example of an appropriate metal oxide. The third protective layer 132 may be formed of insulation material substantially the same as or different from those of the first and second protective layers 120 and 124.

Figure 13:
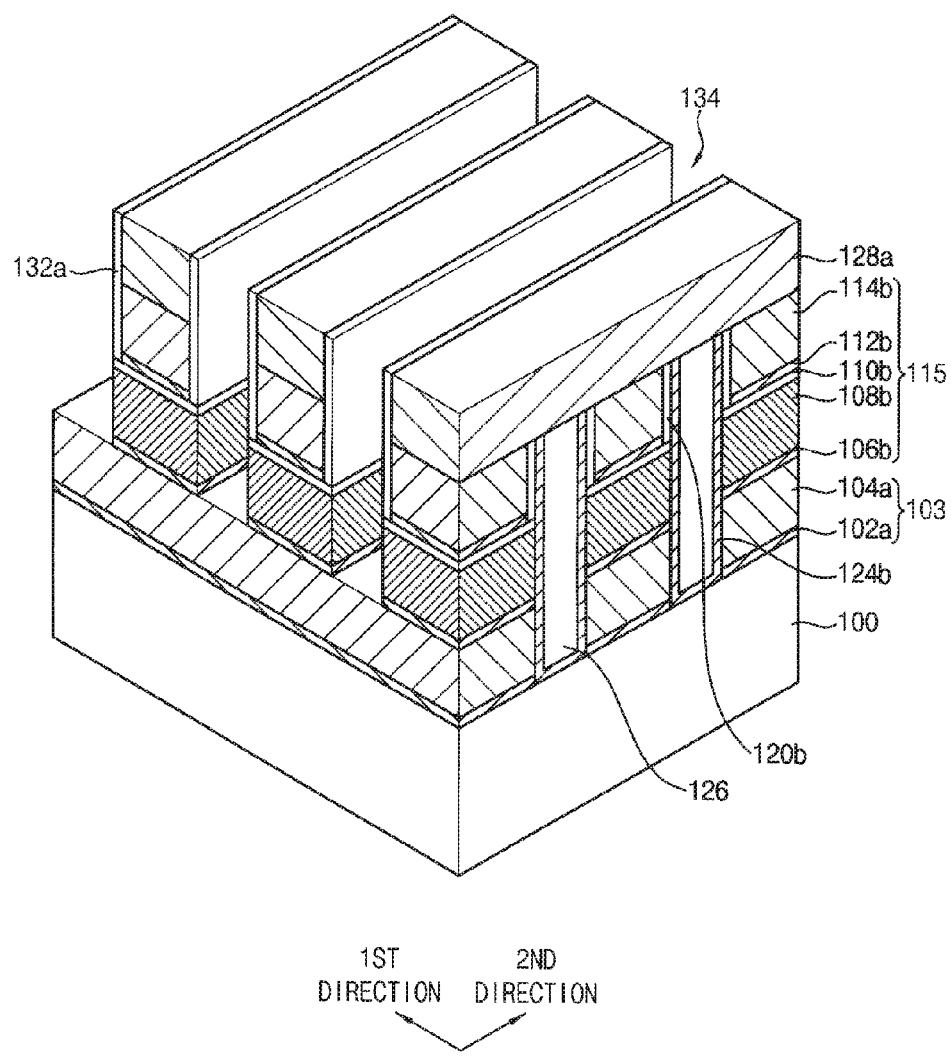

Referring to FIG. 13, the third protective layer 132 may be removed from the bottom of the third trench 129. Subsequently, the second preliminary metal layer pattern 110a, the preliminary selection device pattern 108a and the second preliminary barrier metal layer pattern 106a may be sequentially etched. Accordingly, a second barrier metal layer pattern 106b, a selection device pattern 108b and a second metal layer pattern 110b may be formed. A third protective layer pattern 132a may be formed on side surfaces of the second electrode pattern 128a, the third metal layer pattern 114b and the variable resistance layer pattern 112b. Thus, the third metal layer pattern 114b and the variable resistance layer pattern 112b may be surrounded by the first and third protective layer patterns 120b and 132a. A fourth trench 134 may be defined by a space left when the second preliminary metal layer pattern 110a, the preliminary selection device pattern 108a and the second preliminary barrier metal layer pattern 106a are removed. The second preliminary protective layer pattern 124a may also be etched to form a second protective layer pattern 124b.

By the above-described process, a pillar structure 115 may be obtained. A lower portion of the pillar structure 115, including the second barrier metal layer pattern 106b, the selection device pattern 108b and the second metal layer pattern 110b, may be wider than an upper portion of the pillar structure 115 including the variable resistance layer pattern 112b and the third metal layer pattern 114b, in the first direction. The width of the upper portion of the pillar structure 115 may be equal to the width of the lower portion of the pillar structure plus twice the deposition thickness of the third protective layer 132, again in the first direction. Outer side surfaces of the first and third protective layer patterns 120b and 132a may be coplanar with a side surface of the selection device pattern 108b.

The third protective layer pattern 132a may be formed on the side surface of the variable resistance layer pattern 112b. Thus, the side surface of the variable resistance layer pattern 112b may be covered while the layers under the variable resistance layer pattern 112b are etched. Accordingly, the side surface of the variable resistance layer pattern 112b may be prevented from being damaged by the etching process.

Figure 14:
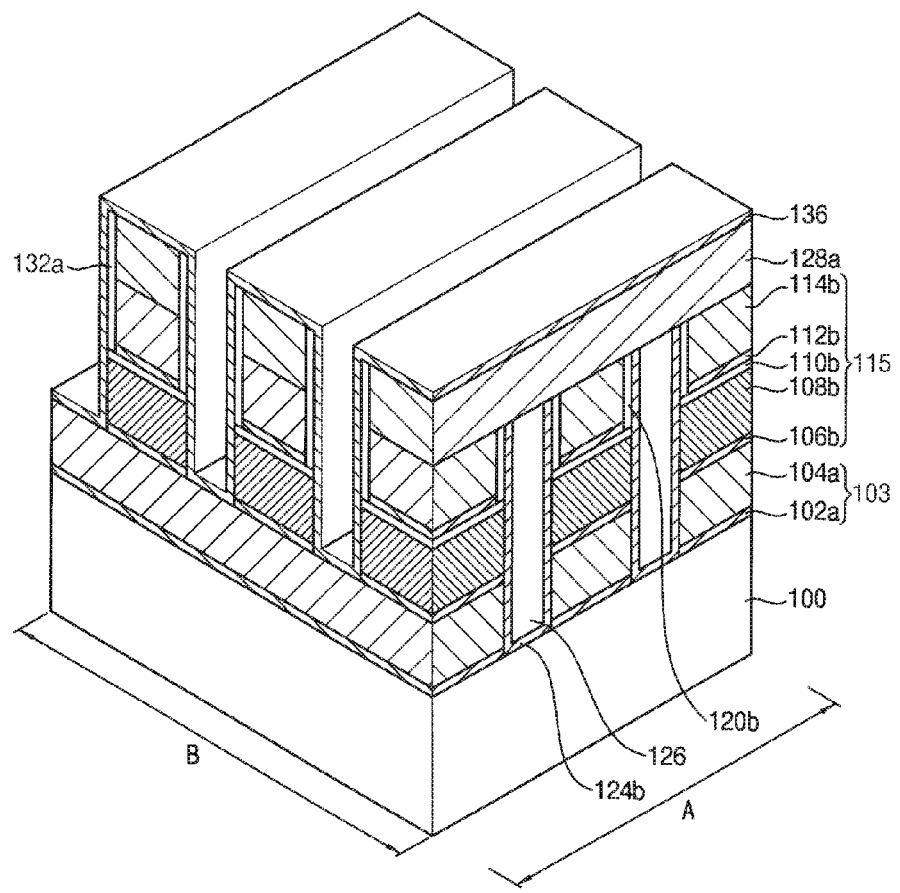

Referring to FIG. 14, a fourth protective layer 136 may be formed on surfaces of the third protective layer pattern 132a, the second metal layer pattern 110b, the selection device pattern 108b and the second barrier metal layer pattern 106b, and along the bottom of the fourth trench 134.

Another embodiment of a semiconductor device according to the inventive concept will now be described in detail with reference to FIGS. 15 and 16.

The semiconductor device may include first electrode patterns 103, pillar structures 115, second electrode patterns 128a, first to fourth protective layer patterns 120b, 142a, 146a and 132b, and fifth protective layer 136a.

Each first electrode pattern 103 may extend longitudinally in a first ($1^{ST}$) direction such the width of the first electrode pattern 103 is that dimension of the pattern 103 in a second ($2^{ND}$) direction perpendicular to the first direction. The first electrode pattern 103 may include a first barrier metal layer pattern 102a and a first metal layer pattern 104a stacked thereon. The third protective layer pattern 146a may be formed on a side surface of the first electrode pattern 103.

Each pillar structure 115 may include a second barrier metal layer pattern 106b, a selection device pattern 108b, a second metal layer pattern 110b, a variable resistance layer pattern 112b and a third metal layer pattern 114b, stacked one atop the other in the foregoing order.

The second barrier metal layer pattern 106b may have a width (dimension in the second direction) equal to the width of the first electrode pattern 103. The selection device pattern 108b and the second metal layer pattern 110b may be narrower, in the second direction, than the barrier metal layer pattern 106b. The variable resistance layer pattern 112b and the third metal layer pattern 114b may be narrower, in the second direction, than the selection device pattern 108b and second metal layer pattern 110b.

The second barrier metal layer pattern 106b, the selection device pattern 108b and the second metal layer pattern 110b may be wider, in the first direction, than the variable resistance layer pattern 112b and the third metal layer pattern 114b.

Thus, the pillar structure 115 may have an upper portion that is narrower than its lower portion. That is, the pillar structure 115 may have bends in its sides at a location where the upper portion and lower portion meet.

Lateral faces of a structure/element facing oppositely in the second direction will be referred to hereinafter as a first side surface and a second side surface of the structure/element. Lateral faces of a structure/element facing oppositely in the first direction will be referred to hereinafter as a third side surface and a fourth side surface of the structure/element.

The first protective layer pattern 120b may be disposed on the first and second side surfaces of the variable resistance layer pattern 112b and the third metal layer pattern 114b. The fourth protective layer pattern 132b may be disposed on the third and fourth side surfaces of the variable resistance layer pattern 112b and the third metal layer pattern 114b. Thus, the first and fourth protective layer patterns 120b and 132b may surround the variable resistance layer pattern 112b to provide protection therefor.

The second protective layer pattern 142a may be disposed on the first protective layer pattern 120b and on the first and second side surfaces of the selection device pattern 108b and the second metal layer pattern 110b. The fifth protective layer 136a may be disposed on the fourth protective layer pattern 132b and on the third and fourth side surfaces of the selection device pattern 108b and the second metal layer pattern 110b. The fifth protective layer 136a may also be disposed on a top surface of the second electrode pattern 128a and an exposed surface of the first electrode pattern 103.

The second protective layer pattern 142a and the fifth protective layer 136a may surround the selection device pattern 108b to provide protection therefor.

The third protective layer pattern 146a may be disposed on the second protective layer pattern 142a, first and second side surfaces of the first electrode pattern 103 and an exposed surface of the substrate 100.

The second electrode pattern 128a may serve as a bit line. The fourth protective layer pattern 132b and the fifth protective layer 136a may be disposed on the third and fourth side surfaces of the second electrode pattern 128a.

In an example of the embodiment described above, the first, second and third protective layer patterns 120b, 142a and 146a are disposed on the first and second side surfaces of the pillar structure 115. The fourth protective layer pattern 132b and the fifth protective layer 136a are disposed on the third and fourth side surfaces of the pillar structure 115. Thus, the side surfaces of the variable resistance layer pattern 112b and the selection device pattern 108b can be prevented from being damaged during etching processes used to manufacture the device.

Figure 15:
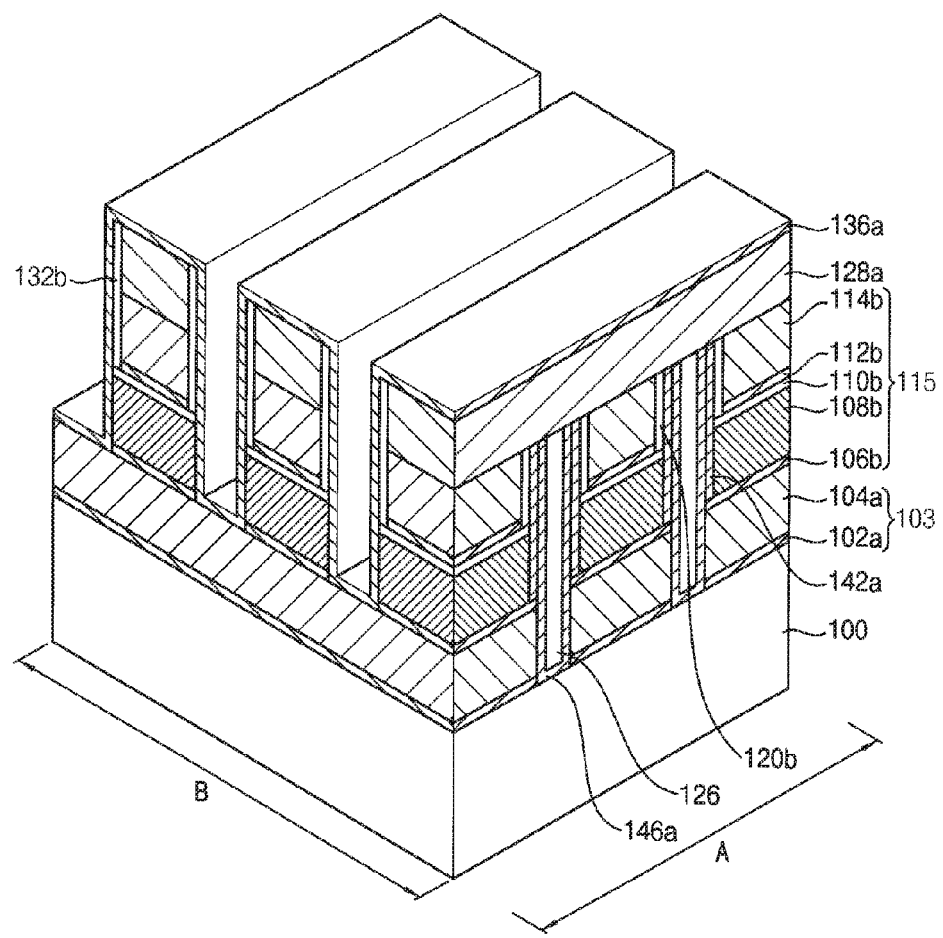
FIG. 15 is a perspective view of another embodiment of a semiconductor device in accordance with the inventive concept.
Figure 16:
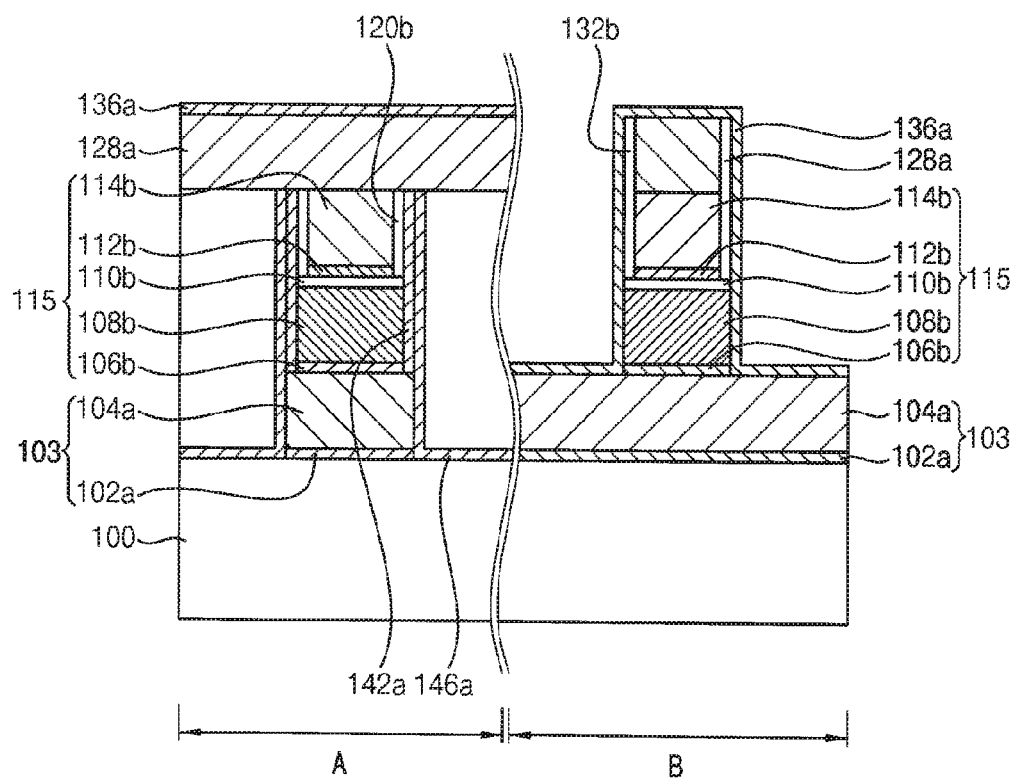
FIG. 16 is a cross-sectional view illustrating the semiconductor device of FIG. 15.
Figure 17:
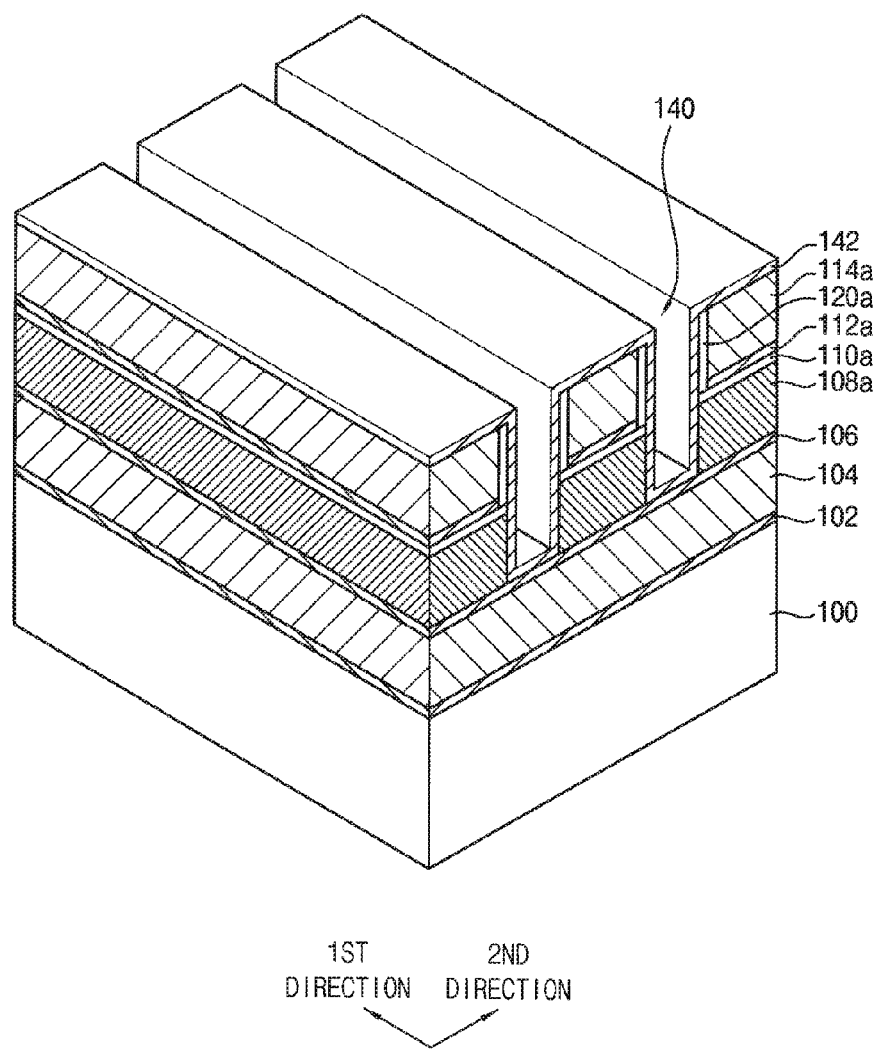
FIGS. 17 and 18 are perspective views for use in illustrating a method of manufacturing the semiconductor device of FIG. 15.
Figure 18:
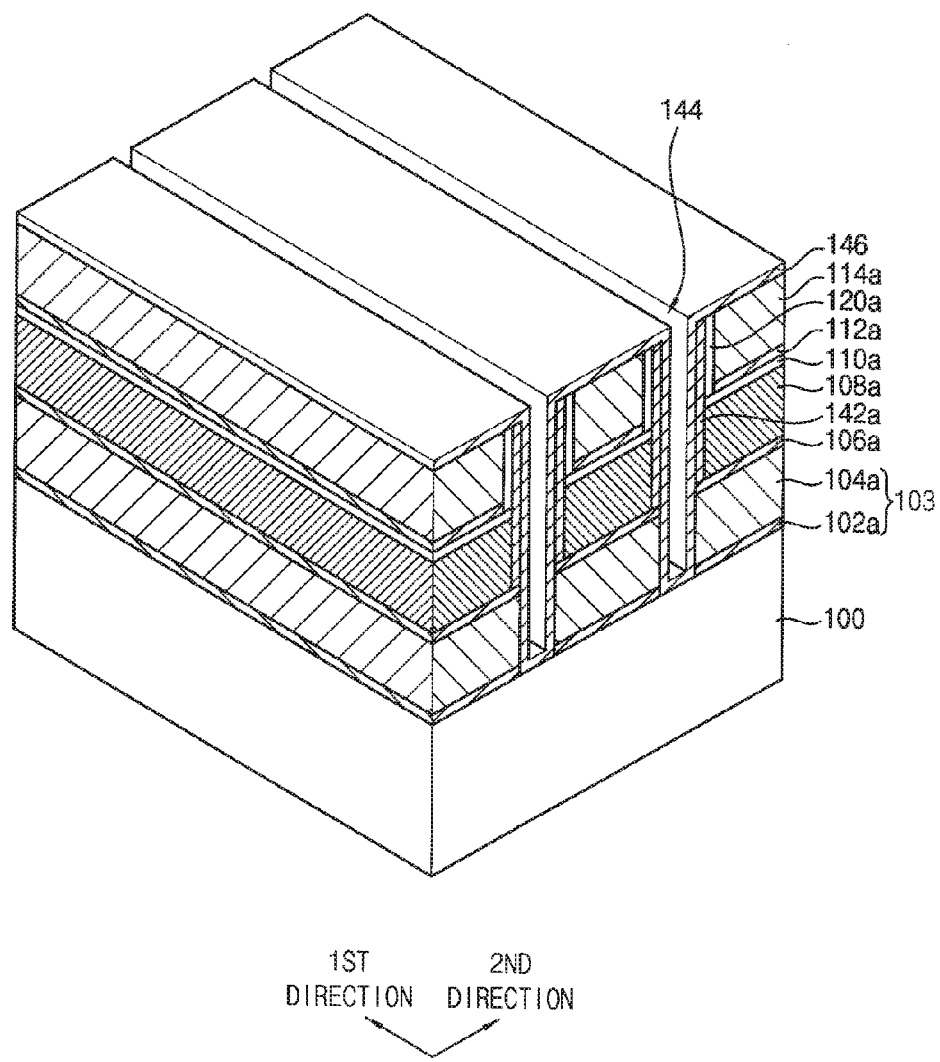

FIGS. 17 and 18 illustrate key steps in a method of manufacturing the semiconductor device of FIG. 15.

First, though, processes substantially the same as those illustrated with reference to FIGS. 3 to 6 may be performed to obtain a structure as shown in FIG. 6.

Referring to FIG. 17, then that portion of the first protective layer 120 on the bottom of the first trench 119 may be etched away.

Subsequently, the second metal layer 110 and the selection device layer 108 may be etched to form a preliminary selection device pattern 108a and a second preliminary metal layer pattern 110a. A first preliminary protective layer pattern 120a may be formed on side surfaces of the preliminary variable resistance layer pattern 112a and the third preliminary metal layer pattern 114a.

A second trench 140 may be formed by the etching process. A side surface of the preliminary protective selection device pattern 108 may be exposed by the second trench 140. The second barrier metal layer 106 may be exposed at the bottom of the second trench 140.

The first protective layer 120 may be formed on side surfaces of the preliminary variable resistance layer pattern 112a. Thus, in this case, the side surfaces of the preliminary variable resistance layer pattern 112a are not exposed while the layers under the preliminary variable resistance layer pattern 112a are etched, such that etching damage to the variable resistance layer pattern 112a is prevented.

A second protective layer 142 may be formed on surfaces of the first preliminary protective layer pattern 120a, the second preliminary metal layer pattern 110a, the preliminary selection device pattern 108a and the second barrier metal layer 106 exposed at the bottom of the second trench 140. The second protective layer 142 may cover at least a side surface of the preliminary selection device pattern 108a to protect the preliminary selection device pattern 108a during a subsequent etching process. The second protective layer 142 may be formed of insulation material, e.g., silicon oxide, silicon nitride or a metal oxide such as aluminum oxide. These may be used alone or in combination. The second protective layer 142 may be formed of substantially the same or different insulation material as the first protective layer pattern 120a.

Referring to FIG. 18, the portion of the second protective layer 142 at the bottom of the second trench 140 may be etched away.

Subsequently, the second barrier metal layer 106, the first metal layer 104 and the first barrier metal layer 102 may be sequentially etched to form a first barrier metal layer pattern 102a, a first metal layer pattern 104a and a second preliminary barrier metal layer pattern 106a. Also, as a result, a second preliminary protective layer pattern 142a may be formed on the side surfaces of the preliminary selection device pattern 108a and the second preliminary metal layer pattern 110a.

A third trench 144 may also be formed by the etching process. A top surface of the substrate 100 may be exposed at the bottom of the third trench 144 at this time.

During the etching process, the side surfaces of the preliminary variable resistance layer pattern 112a and the preliminary selection device pattern 108a may be protected by the first and second preliminary protective layer patterns 120a and 142a to prevent them from being damaged by the etching process.

A third protective layer 146 may be formed on surfaces of the second preliminary protective layer pattern 120a, the second preliminary barrier metal layer pattern 106a, the first metal layer pattern 104a, the first barrier metal layer pattern 102a and the top surface of the substrate 100 exposed by the third trench 144. The third protective layer 146 may be formed of substantially the same or different insulation material as the first and second protective layer 120 and 142.

Processes substantially the same as those illustrated with reference to FIGS. 9 to 14 may then be performed to complete the semiconductor device of FIG. 15.

Figure 19:
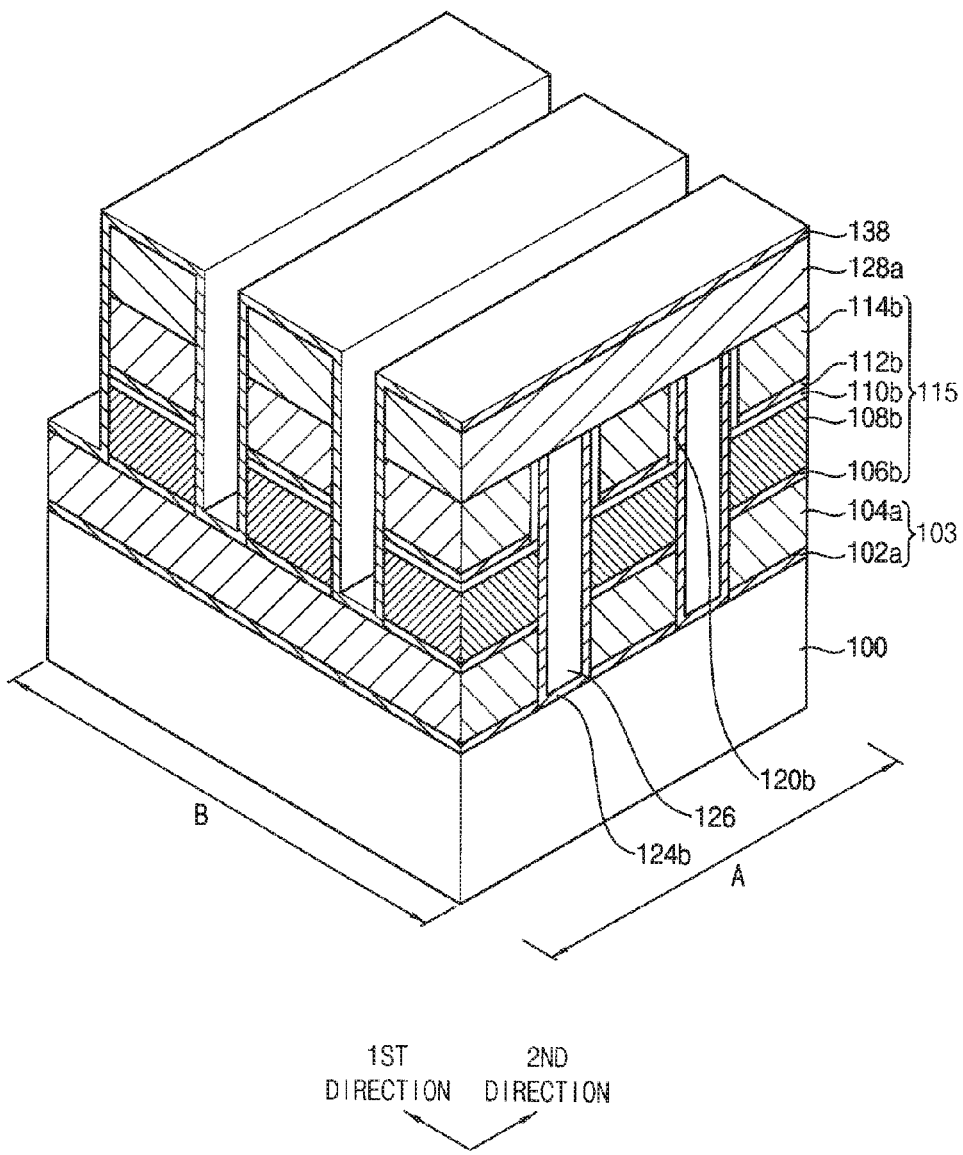
FIG. 19 is a perspective view of still another embodiment of a semiconductor device in accordance with the inventive concept.
Figure 20:
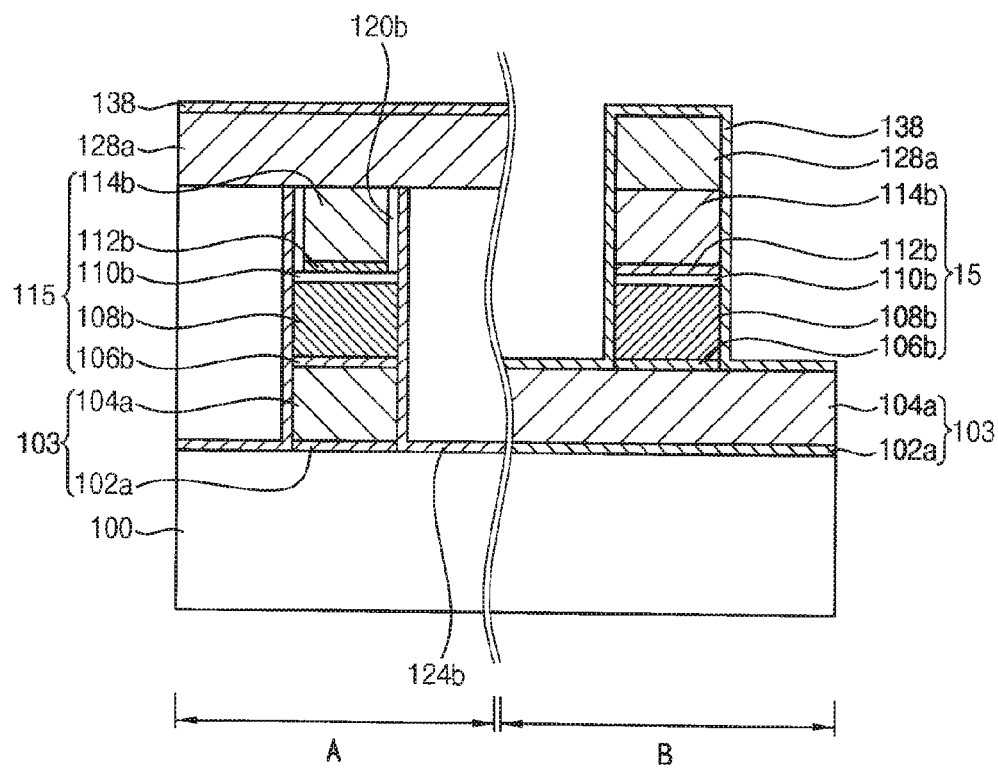
FIG. 20 is a cross-sectional view illustrating the semiconductor device of FIG. 19.

Another embodiment of a semiconductor device according to the inventive concept will now be described in detail with reference to FIGS. 19 and 20.

The semiconductor device may include first electrode patterns 103, pillar structures 115, second electrode patterns 128a, first and second protective layer patterns 120b and 124b, and a third protective layer 138.

The first electrode pattern 103 may extend longitudinally in the first direction. The first electrode pattern 103 may have a stacked structure including a first barrier metal layer pattern 102a and a first metal layer pattern 104a. A second protective layer pattern 124b may be formed on side surfaces of the first electrode pattern 103.

The pillar structure 115 may have a stacked structure including a second barrier metal layer pattern 106b, a selection device pattern 108b, a second metal layer pattern 110b, a variable resistance layer pattern 112b and a third metal layer pattern 114b.

A lower portion of the pillar structure 115, including the second barrier metal layer pattern 106b, the selection device pattern 108b and the second metal layer pattern 110b, may be wider, in the second direction, than an upper portion of the pillar structure 115 including the variable resistance layer pattern 112b and the third metal layer pattern 114b.

The patterns constituting the pillar structure 115 may all have the same width in the first direction.

Lateral faces of an element/structure facing in opposite ways in the second direction may be referred to hereinafter as a first side surface and a second side surface of the element/structure. Lateral faces of an element/structure facing in opposite ways in the first direction may be referred to hereinafter as a third side surface and a fourth side surface of the element/structure.

The first protective layer pattern 120b may be formed on the first and second side surfaces of the variable resistance layer pattern 112b and the third metal layer pattern 114b. The third protective layer 138 may be formed on the third and fourth side surfaces of the variable resistance layer pattern 112b and the third metal layer pattern 114b. Thus, the first protective layer pattern 120b and the third protective layer 138 surround the variable resistance layer pattern 112b to provide protection therefor.

The second protective layer pattern 124b may be formed on a surface of the first protective layer pattern 120b and on the first and second side surfaces of the selection device pattern 108b and the second metal layer pattern 110b. The third protective layer 138 may also be formed on a top surface of the second electrode pattern 128a and an exposed surface of the first electrode pattern 103.

The second electrode pattern 128a may serve as a bit line.

As described above, the first and second protective layer patterns 120b and 124b may be formed on the first and second side surfaces of the pillar structure 115. The third protective layer 138 may be formed on the third and fourth side surfaces of the pillar structure 115. A side surface of the variable resistance layer pattern 112b may be protected by the first protective layer pattern 120b to prevent etching damage thereto.

The semiconductor device of FIG. 19 may be manufactured by a method according to the inventive concept as follows.

Processes substantially the same as those illustrated with reference to FIGS. 3 to 10 may be performed to obtain a structure as shown in FIG. 10.

Figure 21:
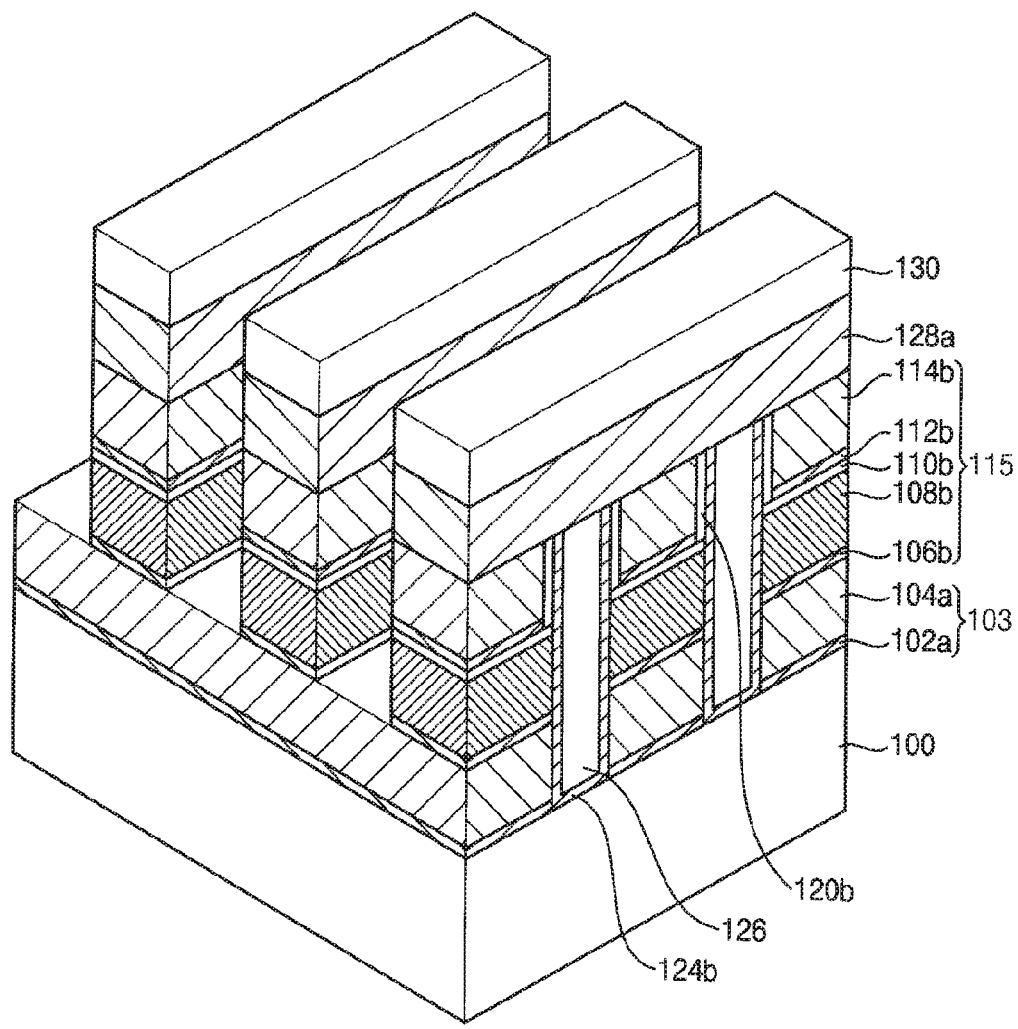
FIG. 21 is a perspective view for use in illustrating a method of manufacturing the semiconductor device of FIG. 19.

Referring to FIG. 21, the fourth metal layer 128, the third preliminary metal layer pattern 114a, the preliminary variable resistance layer pattern 112a, the second preliminary metal layer pattern 110a, the preliminary selection device pattern 108a and the second preliminary barrier metal layer pattern 106a may be etched using the second hard mask pattern 130 as an etching mask. Accordingly, a second electrode pattern 128a, a third metal layer pattern 114b, a variable resistance layer pattern 112b, a second metal layer pattern 110b, a selection device pattern 108b and a second barrier metal layer pattern 106b may be formed.

A pillar structure 115 may be formed by the etching process. A first structure, including the second barrier metal layer pattern 106b, the selection device pattern 108b and the second metal layer pattern 110b, and may be wider, in the second direction, than a second structure including the variable resistance layer pattern 112b and the third metal layer pattern 114b. On the other hand, the width of the first structure, in the first direction, may be equal to that of the second structure plus twice the deposition thickness of the first protective layer 120.

Referring to FIG. 19 again, the second hard mask pattern 130 may be removed. A third protective layer 138 may be formed on surfaces of the second electrode pattern 128a, the third metal layer pattern 114b, the variable resistance layer pattern 112b, the second metal layer pattern 110b, the selection device pattern 108b, the second barrier metal layer pattern 106b and the first electrode pattern 103 to complete the semiconductor device of FIG. 19.

According to an aspect of the inventive concept as described above, a pattern in a multi-layered pattern structure (stack) of a semiconductor device, e.g., a resistive memory device, may be protected by at least one protective layer pattern to reduce the likelihood that the pattern will be damaged when the device is formed using an etching process in which layers constituting the stack are etched. Therefore, the semiconductor device may have a robust mechanical structure and an excellent electrical property.

According to an example of the inventive concept, the variable resistance layer pattern of the semiconductor device is protected as it is being formed so as to have excellent mechanical and electrical reliability. For example, at least first and second protective layer patterns of insulation material, capable of suppressing an etching damage, collectively surround the variable resistance layer pattern 112b, so that etching damage and/or the attaching of etching residue on the sides of the variable resistance layer pattern 112b may be prevented during a patterning process. Thus, the variable resistance layer pattern 112b may have excellent electrical properties.

Therefore, the operational properties of the semiconductor device attributed to the variable resistance layer pattern may be excellent.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of manufacturing a semiconductor device, comprising:
    forming a first electrode layer, a selection device layer and a variable resistance layer sequentially on a substrate;
    selectively etching the variable resistance layer to form preliminary variable resistance layer patterns each extending longitudinally in a first direction;
    forming a first protective layer along sides of the preliminary variable resistance layer patterns, and a top surface of the selection device layer;
    etching portions of the first protective layer, the selection device layer and the first electrode layer situated between the preliminary variable resistance layer patterns to form first protective layer patterns, preliminary selection device patterns and first electrodes;
    forming a second electrode layer on the preliminary variable resistance layer patterns;
    selectively etching the second electrode layer and the preliminary variable resistance layer patterns to form second electrodes and variable resistance layer patterns, the second electrodes each extending longitudinally in a second direction that crosses the first direction;
    forming a second protective layer along side surfaces of the second electrodes, sides the variable resistance layer patterns, and sides of the preliminary selection device patterns; and etching portions of the second protective layer and the preliminary selection device patterns situated between the variable resistance layer patterns to form second protective layer patterns and selection device patterns.

2. The method of claim 1, wherein the first protective layer and the second protective layer are formed of silicon nitride or aluminum oxide.

3. The method of claim 1, further comprising:

forming a third protective layer that covers side surfaces of the first protective layer pattern, sides of the selection device pattern, and side surfaces of the first electrode coplanar with the side surfaces of the first protective layer pattern; and forming a protective layer that covers side surfaces of the second protective layer pattern and sides of the selection device pattern which are coplanar with the side surfaces of the second protective layer pattern.

4. The method of claim 1, further comprising forming at least one metal layer on the selection device layer before the variable resistance layer is formed.

* * * * *